(12) United States Patent
Yanai

(10) Patent No.: US 8,441,560 B2
(45) Date of Patent: May 14, 2013

(54) IMAGE CAPTURING APPARATUS AND CONTROL METHOD THEREFOR

(75) Inventor: Toshikazu Yanai, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 347 days.

(21) Appl. No.: 12/818,203

(22) Filed: Jun. 18, 2010

(65) Prior Publication Data

US 2011/0013052 A1 Jan. 20, 2011

(30) Foreign Application Priority Data

Jul. 15, 2009 (JP) ................................. 2009-167265

(51) Int. Cl.
*H04N 9/64* (2006.01)

(52) U.S. Cl.
USPC .......................................................... 348/243

(58) Field of Classification Search .................... 348/243
See application file for complete search history.

(56) References Cited

U.S. PATENT DOCUMENTS

| | | | | |
|---|---|---|---|---|
| 5,521,639 | A * | 5/1996 | Tomura et al. ................ | 348/243 |
| 7,982,785 | B2 * | 7/2011 | Kinoshita et al. ............. | 348/248 |
| 8,179,461 | B2 * | 5/2012 | Suzuki et al. ................ | 348/294 |
| 2006/0006426 | A1 * | 1/2006 | Inaba ........................... | 257/223 |
| 2006/0007504 | A1 | 1/2006 | Inaba et al. | |

FOREIGN PATENT DOCUMENTS

| | | |
|---|---|---|
| JP | 2000-261730 | 9/2000 |
| JP | 2001-268448 | 9/2001 |
| JP | 2002-064196 | 2/2002 |
| JP | 2003-134400 | 5/2003 |
| JP | 2006-025146 | 1/2006 |
| JP | 2006-147816 A | 6/2006 |

OTHER PUBLICATIONS

The above reference was cited in a Jan. 25, 2013 Japanese Office Action, which is enclosed without an English Translation, that issued in Japanese Patent Application No. 2009-167265.

* cited by examiner

*Primary Examiner* — James Hannett
(74) *Attorney, Agent, or Firm* — Cowan, Liebowitz & Latman, P.C.

(57) ABSTRACT

An image capturing apparatus includes an image sensor including a first reference pixel for black level, a second reference pixel for black level, and an effective pixel, and a processing unit which applies first processing to an output signal from the effective pixel based on an output signal from the first reference pixel for black level, and applies second processing to an output signal from the effective pixel based on an output signal from the second reference pixel for black level. The first reference pixel for black level and the second reference pixel for black level each include a charge-voltage converter which converts electric charge into a voltage and a pixel amplifier which amplifies the voltage of the charge-voltage converter. The pixel amplifiers of the first reference pixel for black level and the second reference pixel for black level differ in arrangement.

13 Claims, 20 Drawing Sheets

IMAGE CAPTURING APPARATUS AND CONTROL METHOD THEREFOR

BACKGROUND OF THE INVENTION

1. Field of the Invention

The present invention relates to a noise reduction technique for reference pixels for black level (OB pixels) in an image capturing apparatus.

2. Description of the Related Art

Recently, advances in image sensors have brought remarkable developments in image capturing apparatus such as electronic still cameras and video cameras. An image sensor typified by a CMOS (Complementary Metal-Oxide Semiconductor) image sensor includes a pixel array in which a plurality of pixels are arranged in the row and column directions, and is composed of an effective pixel region in which photosensitive pixels are arranged and an OB region in which light-shielded reference pixels for black level (OB pixels) are arranged. An image capturing apparatus using such an image sensor includes an OB clamping circuit, which uses OB pixels to remove DC components of dark currents, which greatly vary with variations in conditions such as temperature, and low-frequency variations in signals accompanying power supply variations.

It is theoretically possible to use a vertical (V) OB or horizontal (H) OB as a clamp reference (reference for black level) for such OB clamping. This is, however, based on the assumption that normal pixel outputs are output from an OB region regardless of the system of the OB clamping circuit. If a so-called pixel defect is present in the OB region, clamp information contains information other than proper OB pixel information, resulting in a clamping error. This causes image quality deterioration. When HOB clamping is employed, in particular, a clamp error (clamp offset) occurs on only the target line, which differs in level from the upper and lower lines. This signal level difference appears as horizontal streak noise, which is very noticeable. That is, the presence of a slight defect becomes a factor of poor image quality.

In addition, noise caused by an OB pixel is a factor of horizontal streak noise. It is therefore necessary to perform HOB clamping by using as many OB pixels as possible. For this purpose, the following methods have been proposed. The technique disclosed in Japanese Patent Laid-Open No. 2001-268448 is a method of preventing image quality deterioration caused by OB pixel defects at the time of OB clamping within the range of the operating conditions of an image capturing apparatus (temperature and exposure time) by setting a stricter defect determination level, regarding pixel defects in an image sensor, in an OB region than in a normal effective pixel region. However, this method sets a stricter defect determination level in an OB region than in a normal effective pixel region, and hence decreases the yield of image sensors, resulting in an increase in cost.

In addition, according to the technique disclosed in Japanese Patent Laid-Open No. 2002-064196, in an image sensor including an OB region composed of first OB pixels having photo-electric converters and second OB pixels having no photo-electric converters, this method performs stable HOB clamping by using the second OB pixels including no pixel defects caused by the photo-electric converters, and removes DC components of dark currents by using the average value of the first OB pixels in a signal processing circuit. Furthermore, Japanese Patent Laid-Open No. 2003-134400 discloses an arrangement obtained by applying an arrangement similar to the OB region in Japanese Patent Laid-Open No. 2002-064196 to a CMOS image sensor.

An image capturing apparatus using a CMOS image sensor includes a noise removal circuit which includes a sample/hold circuit and switch transistor for each vertical signal line to remove pixel irregularity caused by threshold variations among the amplification transistors of pixel amplifiers for the respective pixels. However, threshold variations among the transistors in circuits provided for the respective vertical signal lines cause different kinds of noise on the respective columns, resulting in vertical streak noise on a reproduced image, thus causing a new problem.

In order to remove this vertical streak noise, the following method has been proposed. The technique disclosed in Japanese Patent Laid-Open Nos. 2000-261730 and 2006-025146 is a method of removing vertical streak noise by generating a one-line correction signal by adding a plurality of OB line signals read from a VOB region for each column and subtracting the correction signal from an effective pixel line signal from an effective pixel region.

With the recent trend toward the larger number of pixels and advances in semiconductor microfabrication techniques, image sensors have tended to have smaller pixel areas. Along with this tendency, each element included in each pixel tends to be smaller. Consider, for example, a case of the miniaturization of an amplification transistor of each pixel amplifier, which is a MOS transistor for amplifying a signal corresponding to the electric charge generated by a corresponding photo-electric converter.

Letting W be the gate width of an amplification transistor, L be the gate length, and Cox be the gate insulating film capacitance per unit area, it is known that the noise generated by the amplification transistor is inversely proportional to the square root of (W×L×Cox). That is, as the amplification transistor is reduced in size to decrease the gate width or gate length, the random noise generated by the amplification transistor increases. Consequently, even in an image capturing apparatus using a CMOS image sensor, as described above, reducing the pixel area will increase the random noise generated by the amplification transistors of the pixel amplifiers in the effective pixel region and OB region.

According to the Japanese Patent Laid-Open Nos. 2002-064196 and 2003-134400, since clamping operation is executed by using reference signals for black level read from the HOB region, as the amount of noise generated by the amplification transistors of the pixel amplifiers and included in the reference signals for black level increases, the clamping precision decreases. This causes image quality deterioration. Although this problem is reduced by increasing the number of pixels in the HOB region, the area of the image sensor undesirably increases, resulting in another problem.

The technique disclosed in the Japanese Patent Laid-Open Nos. 2000-261730 and 2006-025146 corrects vertical streak noise in signals read from the effective pixel region by using the reference signals for black level read from the VOB region. For this reason, as the amount of noise generated by the amplification transistors of the pixel amplifiers and included in the reference signals for black level increases, the correction precision deteriorates, leading to image quality deterioration. Although the precision of correction signals can be improved by increasing the number of lines in the VOB region to be used, a general image sensor has an angle of view in landscape orientation. For this reason, increasing the number of lines in the VOB region will have greater influence on an increase in the area of the image sensor than increasing the number of pixels in the HOB region.

In clamping using HOB pixels, it is possible to use signals from the HOB pixels, which are read before lines including the HOB pixels for clamping, for integration for clamping.

However, use of only VOB pixels equal in number to the number of lines in a VOB region is allowed for the correction of vertical streak noise because of addition processing for each column. It is therefore difficult to obtain a sufficient number of VOB pixels for the generation of correction signals for vertical streak noise.

SUMMARY OF THE INVENTION

The present invention has been made in consideration of the above problems and implements a technique of reducing noise included in reference signals for black level read from reference pixels for black level used for signal processing such as clamping operation and vertical streak noise correction.

According to a first aspect of the present invention, there is provided an image capturing apparatus comprising: an image sensor including a first reference pixel for black level, a second reference pixel for black level different from the first reference pixel for black level, and an effective pixel; and a processing unit which applies first processing to an output signal from the effective pixel based on an output signal from the first reference pixel for black level, and applies second processing to an output signal from the effective pixel based on an output signal from the second reference pixel for black level, wherein the first reference pixel for black level and the second reference pixel for black level each include a charge-voltage converter which converts electric charge into a voltage and a pixel amplifier which amplifies a voltage of the charge-voltage converter, and the pixel amplifiers of the first reference pixel for black level and the second reference pixel for black level differ in arrangement.

In addition, according to a second aspect of the present invention, there is provided a control method for an image capturing apparatus comprising an image sensor including a first reference pixel for black level, a second reference pixel for black level different from the first reference pixel for black level, and an effective pixel, the method comprising: making each of the first reference pixel for black level and the second reference pixel for black level include a charge-voltage converter which converts electric charge into a voltage and a pixel amplifier which amplifies a voltage of the charge-voltage converter, with the pixel amplifiers of the first reference pixel for black level and the second reference pixel for black level differing in arrangement; and applying first processing to an output signal from the effective pixel based on an output signal from the first reference pixel for black level, and applying second processing to an output signal from the effective pixel based on an output signal from the second reference pixel for black level.

Further features of the present invention will become apparent from the following description of exemplary embodiments with reference to the attached drawings.

DESCRIPTION OF THE EMBODIMENTS

The embodiments of the present invention will be described in detail below with reference to the accompanying drawings. Note that the embodiments described below each are an example of a means for implementing the present invention, and should be modified or changed, as needed, depending on the arrangement of an apparatus to which the present invention is applied or various conditions. The present invention is not limited to the following embodiments.

Figure 1:
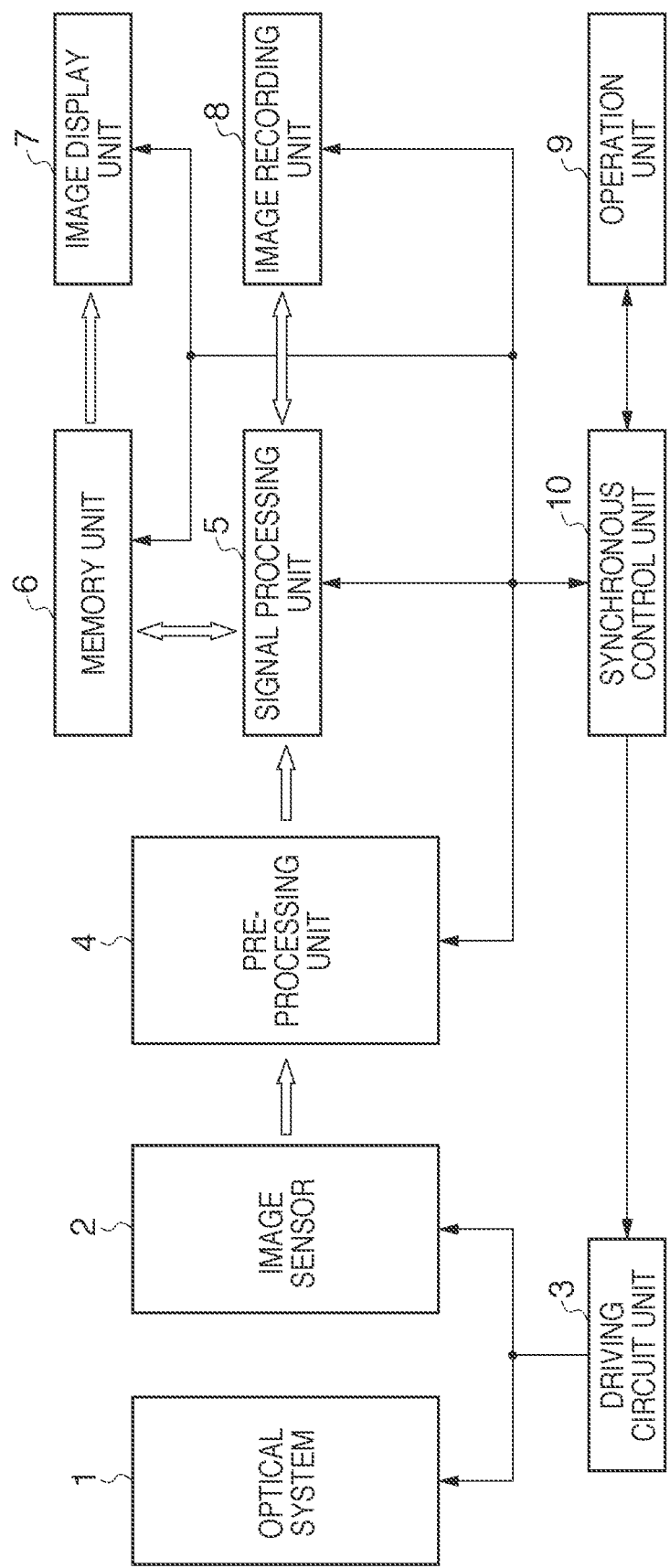
FIG. 1 is a block diagram showing the arrangement of an image capturing apparatus according to an embodiment of the present invention.

FIG. 1 is a block diagram showing the arrangement of an image capturing apparatus according to an embodiment of the present invention. The image capturing apparatus according to this embodiment is implemented by an electronic still camera, a video camera, or the like, and includes an image display unit capable of displaying an image obtained by a high-resolution image sensor and an image recording unit capable of recording. The image capturing apparatus in FIG. 1 includes an optical system 1, an image sensor 2, a driving circuit unit 3, a preprocessing unit 4, a signal processing unit 5, a memory unit 6 to store image data, an image display unit 7, an image recording unit 8, an operation unit 9, and a synchronization control unit 10. The optical system 1 includes a focusing lens to make the image sensor 2 focus on an object, a zoom lens to perform optical zooming, a stop to adjust the brightness of the object, and a shutter to control exposure. The driving circuit unit 3 drives these components. The image sensor 2 includes a plurality of pixels arranged in the horizontal and vertical directions, and a circuit to output signals read from pixels in a predetermined order. The driving circuit unit 3 drives the optical system 1 and the image sensor 2 by applying constant voltages or pulses with enhanced driving performance to them in accordance with control signals from the synchronization control unit 10. The driving circuit unit 3 also has a function of transferring a control signal from the synchronization control unit 10 to the image sensor 2.

The preprocessing unit 4 is controlled by a control signal from the synchronization control unit 10, and includes a correlation double sampling circuit (CDS circuit) to remove noise components such as reset noise included in the analog signal output from the image sensor 2. The preprocessing unit 4 includes a gain control amplifier to adjust the amplitude of a signal from which noise is removed and an A/D conversion circuit to convert the analog signal whose amplitude is adjusted into a digital signal.

In this embodiment of the present invention, the preprocessing unit 4 (processing means) executes clamping operation using reference signals for black level read from a VOB region or HOB region. The clamping circuit of the preprocessing unit 4 detects output signals from the VOB region or HOB region during a clamp period in which a clamp pulse is kept enabled, integrates the detected output signals over a predetermined period, and executes clamping operation by using the integrated signal as a clamp voltage. The preprocessing unit 4 then subtracts the difference between the clamp voltage and a predetermined clamp reference voltage from an output signal before detection, and feeds back the resultant signal, thereby converging the clamp voltage of the clamping circuit to the clamp reference voltage. The preprocessing unit 4 performs subsequent signal processing with reference to the OB region clamped by the clamp voltage.

It is possible to change the clamp time constant (effect) by changing the feedback ratio of the difference between the clamp voltage integrated in the clamping circuit and the predetermined clamp reference voltage. For example, increasing the clamp time constant will decrease the feedback ratio. In this case, it takes time for the clamp voltage to converge to the clamp reference voltage. However, it is possible to perform stable clamping even with changes in output signal. Decreasing the clamp time constant will increase the feedback ratio. This speeds up convergence to the clamp reference voltage. However, clamping operation sensitively reacts to changes in output signal. A control signal from the synchronization control unit 10 controls a change of the clamp time constant.

The signal processing unit 5 (processing means) is controlled by a control signal from the synchronization control unit 10 to convert the output signal transmitted from the preprocessing unit 4, which is converted into a digital signal, into image data upon performing proper signal processing for it, and outputs the image data converted into a digital signal to the memory unit 6 or image recording unit 8. The signal processing unit 5 also performs signal processing for an output signal converted into a digital signal or image data from the memory unit 6 or image recording unit 8. In addition, the signal processing unit 5 has a function of detecting photometric data such as an in-focus state and exposure amount from output signals from the image sensor 2 and sending detection signals to the synchronization control unit 10 and includes a correction circuit to execute correcting operation for vertical streak noise.

Vertical streak noise can be corrected by generating a one-line correction signal from reference signals for black level read from a VOB region and subtracting the correction signal from an output signal from the image sensor. In this embodiment, the signal processing unit 5 executes digital clamping operation using reference signals for black levels read from an HOB region. Digital clamping processing can be implemented by adding and averaging reference signals for black level and subtracting the resultant signal from an output signal from the image sensor. Since the memory unit 6, image display unit 7, image recording unit 8, and operation unit 9 have general arrangements, a detailed description of them will be omitted. The synchronization control unit 10 controls the overall image capturing apparatus in accordance with instructions from the operation unit 9. The synchronization control unit 10 also controls the optical system 1 to form an optimal object image on the image sensor 2 in accordance with photometric data such as an in-focus state and an exposure light amount transmitted from the signal processing unit 5. Furthermore, the synchronization control unit 10 can detect the use state of the memory unit 6, the attached/detached state of a memory of the image recording unit 8, and the use state of the image recording unit 8.

Figure 2:
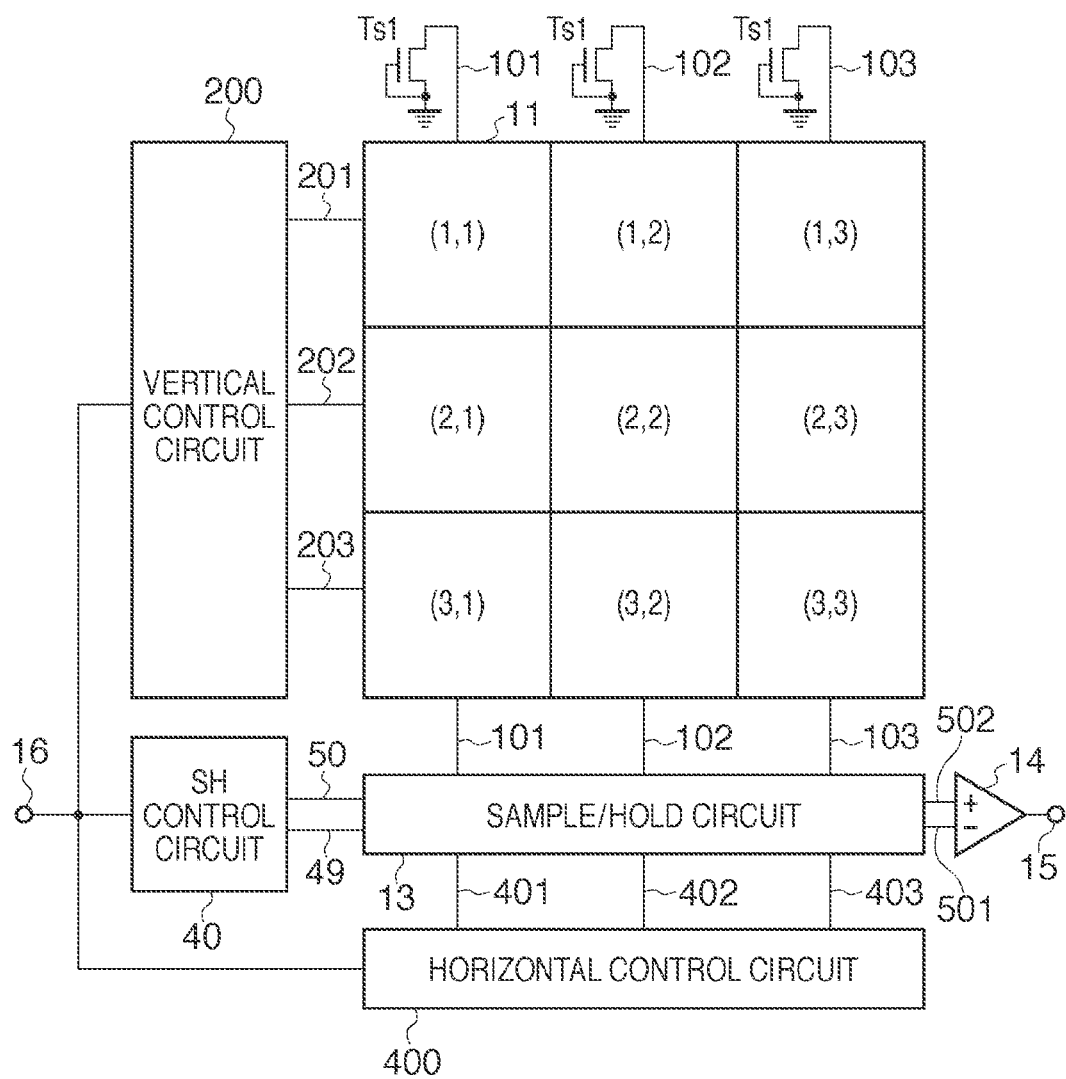
FIG. 2 is a block diagram showing the detailed arrangement of an image sensor in FIG. 1.

The image sensor 2 will be described in detail next with reference to FIGS. 2 to 4. For the sake of descriptive convenience, referring to FIG. 2, the number of pixels of the image sensor 2 is 3 pixels in the horizontal direction and 3 pixels in the vertical direction. However, the present invention is not limited to this. Referring to FIG. 2, a pixel 11 is one of the pixels (photosensitive pixels) which convert incident light (optical signals) into electric signals. An address indicating the position of a pixel in the horizontal direction (H) and the vertical direction (V) is represented by (1, 1). All the pixels have the same arrangement except that different vertical control lines and different vertical signal lines are connected to the respective pixels. An address indicating the position of each pixel is represented by (V, H).

Figure 3:
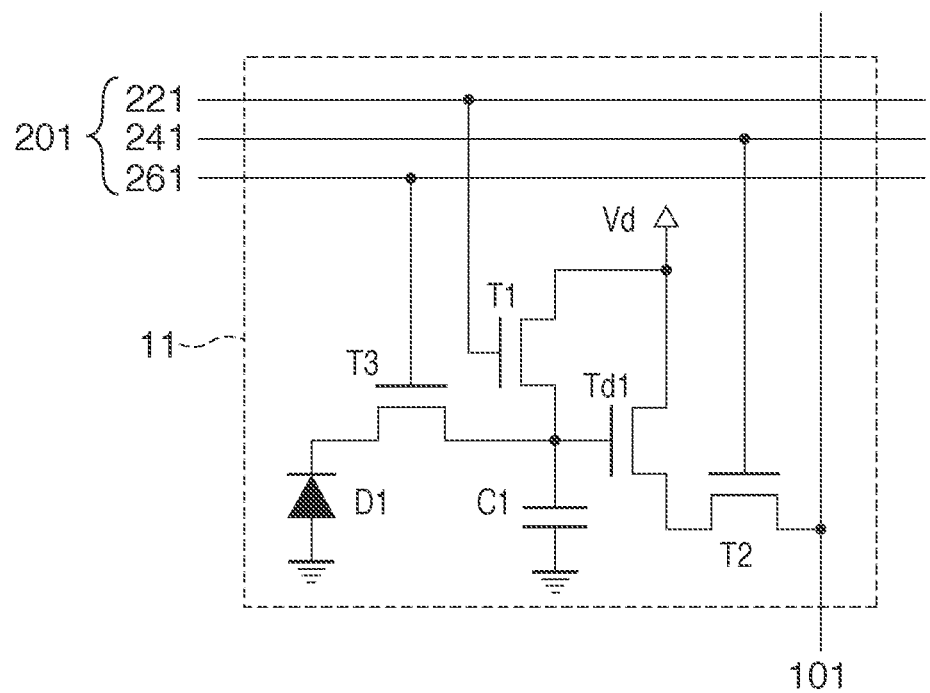
FIG. 3 is a circuit diagram showing the detailed arrangement of a photosensitive pixel of the image sensor.

FIG. 3 is a circuit diagram showing an example of the arrangement of the pixel 11. Referring to FIG. 3, the portion enclosed by the dotted line corresponds to the pixel 11, which is connected to other circuits via a vertical control line 201 and a vertical signal line 101. The vertical control line 201 is commonly connected to the pixels on one horizontal row, and simultaneously controls the pixels on one horizontal row to enable resetting or signal reading operation. The vertical signal line 101 is commonly connected to the pixels on one vertical column, and outputs pixel signals. Note that the vertical control line 201 includes a reset control line 221, a vertical address line 241, and a transfer control line 261.

A photo-electric conversion element D1 (photo-electric converter) converts light into electric charge, and stores the converted electric charge. The P side of the P-N junction is grounded, and the N side is connected to the source of a transfer transistor (transfer switch) T3. The gate of the transfer transistor (transfer switch) T3 is connected to the transfer control line 261, and the drain is connected to an FD capacitor C1 to control the transfer of electric charge from the photo-electric conversion element D1 to the FD capacitor C1. The FD capacitor C1 (charge-voltage converter) stores the electric charge transferred from the photo-electric conversion element D1 when converting the electric charge into a voltage. The gate of a reset transistor (reset switch) T1 is connected to the reset control line 221, the drain is connected to a power supply Vd, and the source is connected to the FD capacitor C1 to reset the voltage of the FD capacitor C1. A driving transistor Td1 is a transistor forming a pixel amplifier. The gate, drain, and source of the driving transistor Td1 are respectively connected to the FD capacitor C1, the power supply Vd, and a selection transistor (selection switch) T2. The driving transistor Td1 outputs a voltage corresponding to the voltage of the FD capacitor C1. The gate and source of the selection transistor (selection switch) T2 are respectively connected to the vertical address line 241 and the vertical signal line 101.

The selection transistor T2 outputs an output from the driving transistor Td1 as an output signal of the pixel 11 to the vertical signal line 101.

Referring back to FIG. 2, load transistors Ts1 are respectively connected to the vertical signal line 101, a vertical signal line 102, and a vertical signal line 103 such that the drains are connected to the vertical signal lines 101 to 103, and the gates and the sources are grounded. With this arrangement, the load transistors Ts1 serve as gate-grounded constant current sources. The load transistors Ts1 and the driving transistors Td1 of the pixels 11 on the columns which are connected to each other via the corresponding vertical signal lines 101 and 103 constitute source-follower circuits serving as pixel amplifiers. A vertical control circuit 200 selects the vertical control line 201, a vertical control line 202, and a vertical control line 203 connected to pixels to be read, in a predetermined order, in accordance with instructions of control signals from the synchronization control unit 10 via a control input terminal 16, thereby controlling shutter operation and reading operation for the respective pixels. A sample/hold circuit 13 is controlled by SH control lines 49 and 50, and can send signals from pixels, which are sent via the vertical signal lines 101 to 103, to an output circuit 14. The output circuit 14 includes a current amplification circuit or voltage amplification circuit serving as a differential amplification circuit. The output circuit 14 amplifies a sent signal into a proper current or voltage and outputs it to the preprocessing unit 4 via an output terminal 15. An SH control circuit 40 controls the sample/hold circuit 13 in accordance with an instruction of a control signal from the synchronization control unit 10 via the control input terminal 16. A horizontal control circuit 400 can select horizontal control lines 401 to 403, in a predetermined order, in accordance with instructions of control signals from the synchronization control unit 10 via the control input terminal 16.

Figure 4:
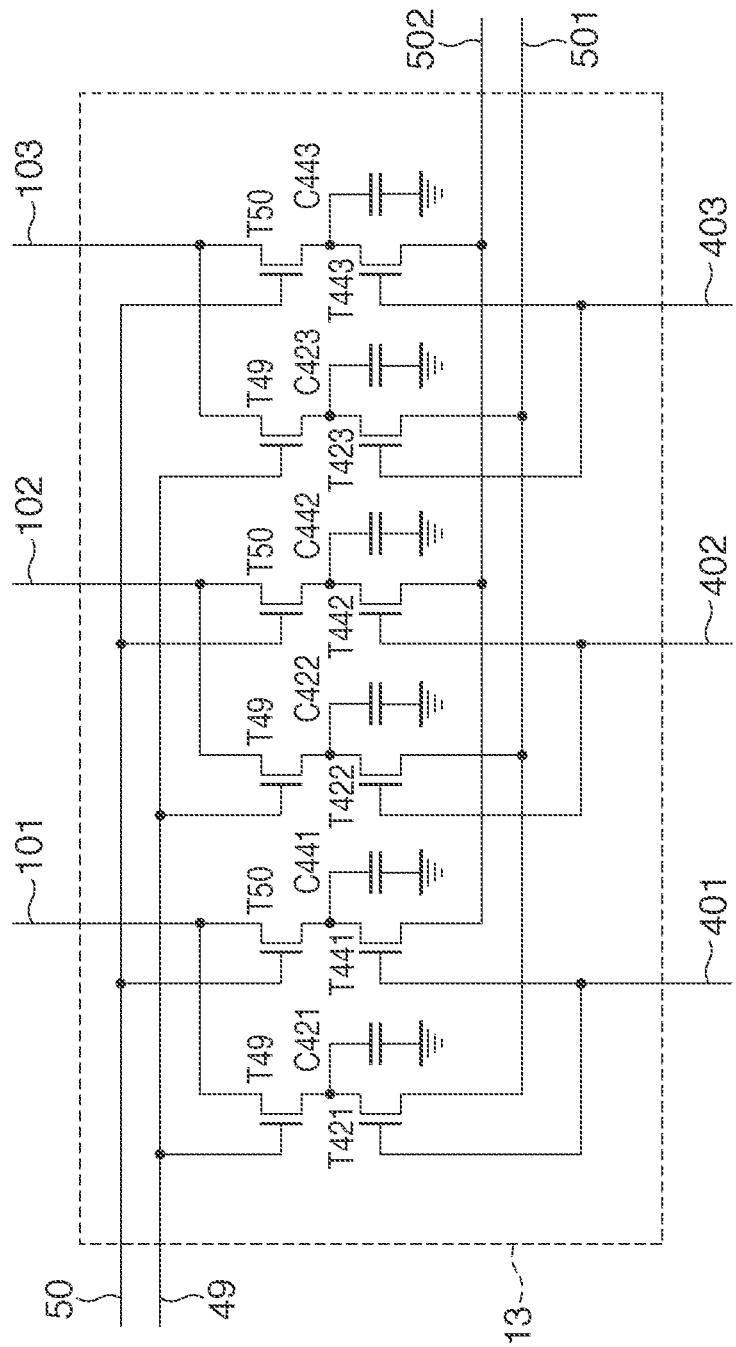
FIG. 4 is a circuit diagram showing the detailed arrangement of the sample/hold circuit of the image sensor.

FIG. 4 shows an example of the arrangement of the sample/hold circuit 13. The sample/hold circuit 13 includes transistors T49 and T50 controlled by the SH control lines 49 and 50, transistors T421 to T423 and T441 to T443 controlled by the horizontal control lines 401 to 403, and storage capacitors C421 to C423 and C441 to C443 which store the signals sent via the transistors T49 and T50. Assume that in this embodiment, the transistors other than the driving transistors Td1 and the load transistors Ts1 function as switches which are turned on and off as the control lines connected to their gates are turned on and off.

In this case, noise reading operation and pixel signal reading operation of the image sensor 2 will be described below. Each vertical control line controls all the pixels on one horizontal row, and hence a pixel (1, 1) will be described as an example. The same applies to the operation of other pixels. Noise reading operation in a case in which the pixels on one horizontal row in the image sensor 2 are read will be described first. While the transfer transistor T3 is off, the reset control line 221 turns on the reset transistor T1 to reset the voltage of the FD capacitor C1, and then turns off the reset transistor T1. The vertical address line 241 then turns on the selection transistor T2 to output the reset voltage of the FD capacitor C1 to the vertical signal line (signal output line) 101. This signal is defined as a noise signal. The operation of reading such a noise signal is defined as noise reading operation. The vertical address line 241 then turns off the selection transistor T2, as needed. In the sample/hold circuit 13 at the time of noise reading operation, the transistors T421 to T423 are off, and the transistor T49 is turned on under the control of the SH control line 49 to store, in the storage capacitors C421 to C423, the noise signals sent to the vertical signal lines 101 to 103. Thereafter, the transistor T49 is turned off to hold the noise signals in the sample/hold circuit 13.

Pixel signal reading operation will be described next. While the reset transistor T1 is off, the transfer control line 261 turns on the transfer transistor T3 to transfer electric charge from the photo-electric conversion element D1 to the FD capacitor C1. The noise signal generated in the FD capacitor C1 is added to the electric charge transferred from the photo-electric conversion element D1. The resultant signal is then charge-voltage-converted as a pixel signal. The vertical address line 241 then turns on the selection transistor T2 to output the signal voltage of the FD capacitor C1 to the vertical signal line 101. This signal is defined as a pixel signal. The operation of reading this pixel signal is defined as pixel signal reading operation. The vertical address line 241 then turns off the selection transistor T2, as needed. In the sample/hold circuit 13 at the time of pixel signal reading operation, while the transistors T441 to T443 are off, the transistor T50 is turned on under the control of the SH control line 50 to store, in the storage capacitors C441 to C443, the pixel signals sent to the vertical signal lines 101 to 103. Thereafter, the transistor T50 is turned off to hold the pixel signals in the sample/hold circuit 13.

According to the above description, noise reading operation and pixel signal reading operation are separately executed. However, it is possible to execute a series of operations from noise reading to pixel signal reading in the following manner as continuous signal reading operation.

In continuous signal reading operation, noise reading operation is performed first. When pixels on one horizontal row in the image sensor 2 are to be read, while the transfer transistor T3 is off, the reset control line 221 turns on the reset transistor T1 to reset the voltage of the FD capacitor C1, and then turns off the reset transistor T1.

The vertical address line 241 then turns on the selection transistor T2 to output the reset voltage of the FD capacitor C1 to the vertical signal lines 101 to 103. This signal becomes a noise signal. While the transistors T421 to T423 are off, the transistor T49 is turned on under the control of the SH control line 49 to store the signal in the storage capacitors C421 to C423. Thereafter, the transistor T49 is turned off to hold the signal in the sample/hold circuit 13.

In this state, since the reset transistor T1 is kept off at the pixel (1, 1), pixel signal reading operation continues.

When the transfer control line 261 turns on transfer transistor T3, electric charge is transferred from the photo-electric conversion element D1 to the FD capacitor C1. The noise signal generated in the FD capacitor C1 is added to the electric charge transferred from the photo-electric conversion element D1. The resultant signal is then charge-voltage-converted as a pixel signal. In this case, since the selection transistor T2 is kept on, the signal voltage of the FD capacitor C1 obtained by addition is output to the vertical signal lines 101 to 103. This signal becomes a pixel signal. While the transistors T441 to T443 are off, the transistor T50 is turned on under the control of the SH control line 50 to store the signal in the storage capacitors C441 to C443. Thereafter, the transistor T50 is turned off to hold the signal in the sample/hold circuit 13.

The vertical address line 241 then turns off the selection transistor T2, as needed. The above operation is continuous signal reading operation.

The horizontal control circuit 400 then sequentially selects the horizontal control lines 401 to 403 in accordance with control signals from the synchronization control unit 10 to sequentially turn on the transistors T421 to T423 and T441 to T443. The noise signals stored in the storage capacitors C421 to C423 and the noise signals stored in the storage capacitors C441 to C443, which correspond to the selected horizontal control lines, are respectively output to a horizontal noise line 501 and a horizontal signal line 502. In this manner, the differential outputs between the pixel signals and the noise signals corresponding to one horizontal row held in the sample/hold circuit 13 are output via the output circuit 14. Performing the above operation for all the pixels will complete reading operation corresponding to one frame.

This embodiment executes the operation of subtracting, from a pixel signal, a noise signal generated when the FD capacitor C1 corresponding to the input of the driving transistor Td1 of the pixel amplifier is reset. This makes it possible to effectively remove offset noise for each pixel which is caused by variations in transistors or storage capacitors constituting pixels. With regard to random noise generated by the driving transistor Td1 of each pixel amplifier, if the magnitude of random noise generated in noise reading operation differs from that generated in pixel signal reading operation, noise is left even after the operation of subtracting a noise signal from a pixel signal. If random noise generated in noise reading operation is opposite in sign to that generated in pixel signal reading operation, in particular, subtracting a noise signal from a pixel signal will increase random noise.

If such random noise is generated by an OB pixel in a VOB region, it is impossible to obtain the necessary number of normal reference signals for black level for VOB clamping (clamping processing in the vertical direction) by the preprocessing unit 4. As a consequence, the preprocessing unit 4 sends an erroneously clamped output signal to the signal processing unit 5 without making the clamp voltage converge to the clamp reference voltage. In addition, when such random noise is generated by an OB pixel in an HOB region, it is impossible for the preprocessing unit 4 to obtain the necessary number of normal reference signals for black level for HOB clamping (clamping processing in the horizontal direction). As a consequence, the preprocessing unit 4 performs clamping operation at different clamp voltages on the respective lines, and hence generates horizontal streak noise.

In addition, even in the image capturing apparatus according to this embodiment, output differences are generated among the sample/hold circuits for the respective columns due to variations in transistors or storage capacitors constituting the sample/hold circuits or different signal paths for noise reading operation and pixel signal reading operation. This influences one vertical column to cause vertical streak noise. It is possible to correct this vertical streak noise by generating a one-line correction signal from reference signals for black level read from a VOB region by the signal processing unit 5 and subtracting the correction signal from an output signal output from the image sensor. If, however, such random noise is generated in a VOB region, it is impossible to generate a correct correction signal for vertical streak noise. As described above, when correcting vertical streak noise, this apparatus can secure only a small number of lines in a VOB region, this operation is more susceptible to random noise generated by an OB pixel than VOB clamping or HOB clamping. The following is a method of reducing noise generated by driving transistors of pixel amplifiers in an OB region and the operation of the image capturing apparatus using reference signals for black level read from the OB region.

First Embodiment

Figure 5:
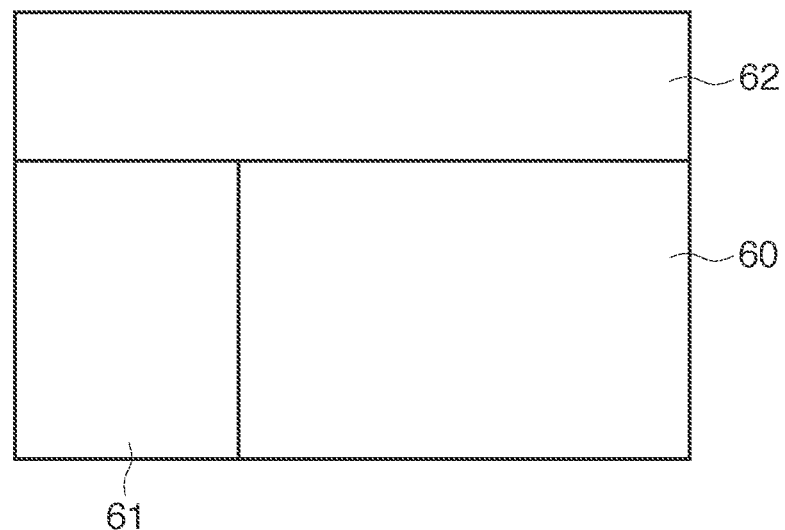
FIG. 5 is a view showing the pixel array of the image sensor.

The first embodiment of the present invention will be described with reference to FIGS. 5 to 9 in addition to FIGS. 1 to 4. FIG. 5 is a view showing the pixel array of an image sensor 2 in the first embodiment of the present invention. Reference numeral 60 denotes an effective pixel region in which photosensitive pixels (FIG. 3) including photo-electric conversion elements are arranged; 61, a first OB region (a region of reference pixels for black level) in which light-shielded pixels (first reference pixels for black level) are arranged; and 62, a second OB region (a region of reference pixels for black level) in which light-shielded pixels (second reference pixels for black level) are arranged. According to the above description made with reference to FIG. 2, the number of pixels of the image sensor 2 is 3 pixels in the horizontal direction and 3 pixels in the vertical direction. Referring to FIG. 5, assume that the image sensor has a sufficient number of pixels for clamping operation using reference signals for black level or vertical streak noise correcting operation (vertical streak noise correction processing).

Figure 6:
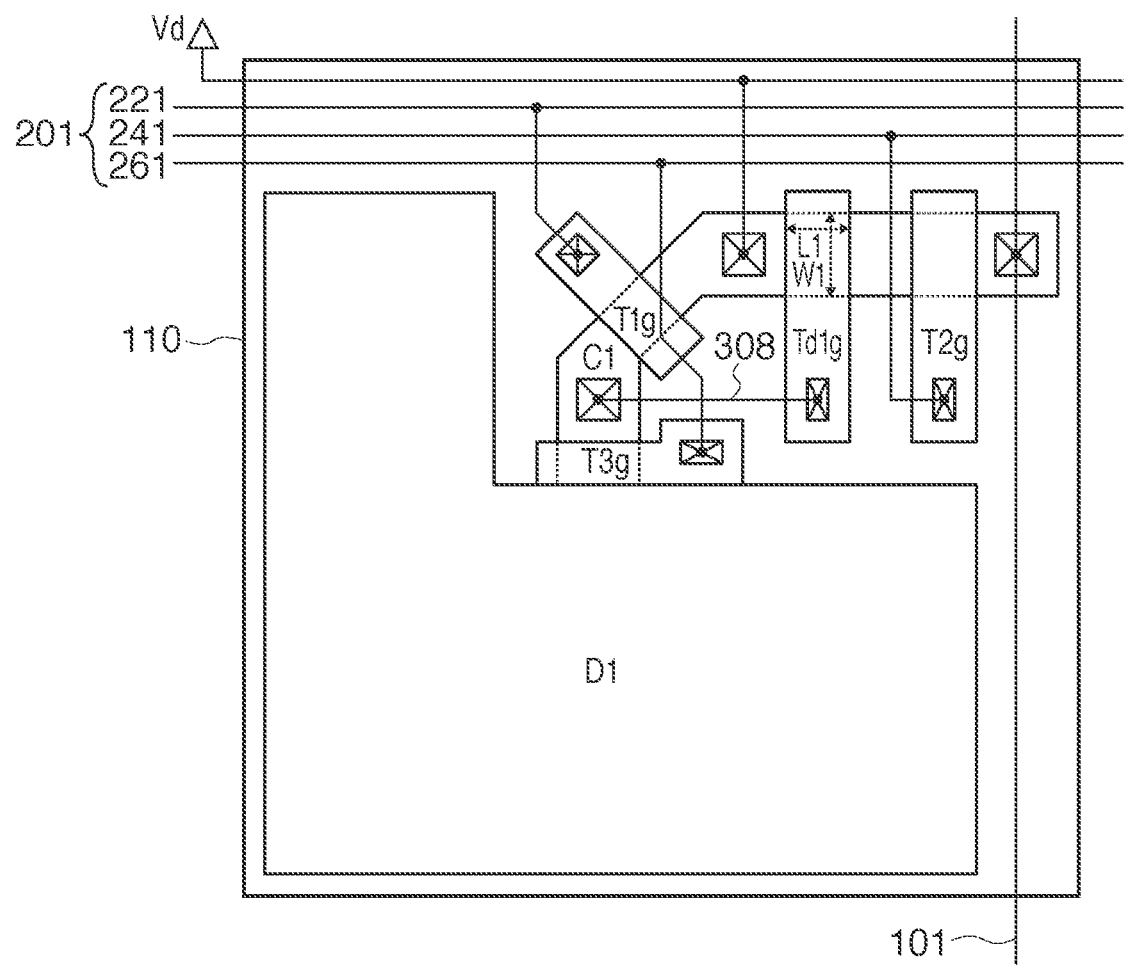
FIG. 6 is a view showing the layout of a photosensitive pixel of the image sensor.

FIG. 6 is a view showing the layout of a photosensitive pixel (FIG. 3) including a photo-electric conversion element. Referring to FIG. 6, components other than a photo-electric conversion element D1, an FD capacitor C1, the gates, sources, and drains of the respective transistors, and interconnections will not be illustrated. In addition, the interconnections are simplified. The same reference numerals as in FIG. 3 denote the same components in FIG. 6. Reference numeral 110 denotes a photosensitive pixel including a photo-electric conversion element. Reference symbol T3g denotes the gate of a transfer transistor T3; T1g, the gate of a reset transistor T1; Td1g, the gate of a driving transistor Td1; and T2g, the gate of a selection transistor T2. The FD capacitor C1 is connected to the gate Td1g of the driving transistor via an interconnection 308. Reference symbol W1 denotes the gate width of the driving transistor Td1; and L1, the gate length. In this case, W1 and L1 may respectively represent the channel width and channel length of the gate Td1g of the driving transistor. The photosensitive pixels 110 are arranged in the effective pixel region 60.

Figure 7:
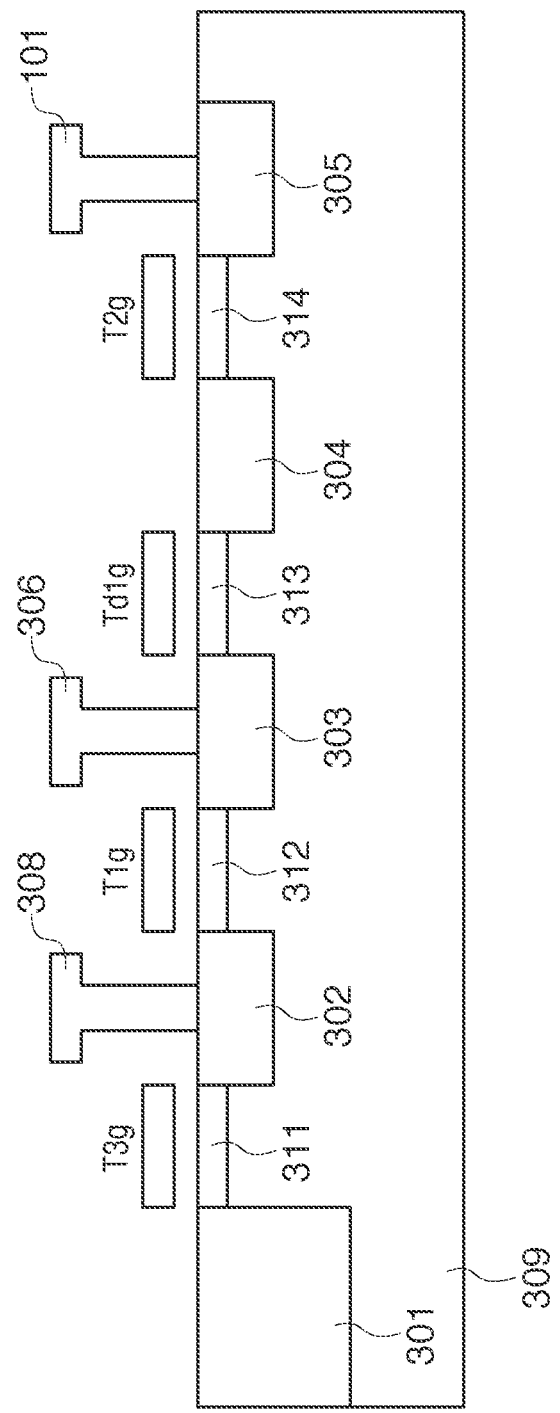
FIG. 7 is a sectional view of a pixel of the image sensor.

FIG. 7 shows a cross-section including the channel regions of transistors in the range from the photo-electric conversion element D1 in FIG. 6 to the connection portion of a vertical signal line 101. Reference numeral 301 denotes the photo-electric conversion element D1; and 302, an FD capacitor C1 portion, which also serves as the connection portion between the drain of the transfer transistor T3 and the source of the reset transistor T1. This portion also serves as the connection portion of the interconnection 308 which connects the FD capacitor C1 to the gate Td1g of the driving transistor. Reference numeral 303 denotes the connection portion of an interconnection 306 of a power supply Vd and also the connection portion between the drain of the reset transistor T1 and the drain of the driving transistor Td1; 304, the connection portion between the source of the driving transistor Td1 and the drain of the selection transistor T2; 305, the connection portion of the vertical signal line 101, which is the source of the selection transistor T2; 311, the channel portion of the transfer transistor T3; 312, the channel portion of the reset transistor T1; 313, the channel portion of the driving transistor Td1; and 314, the channel portion of the selection transistor T2.

Figure 8:
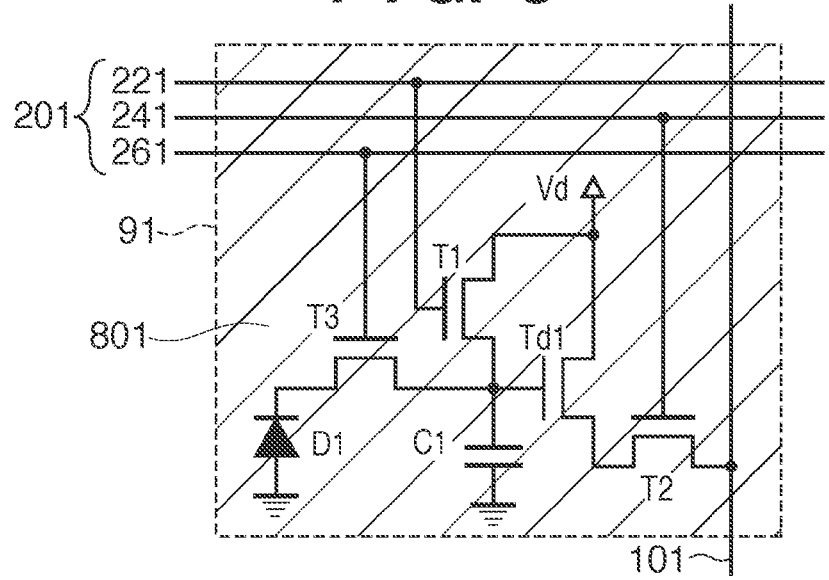
FIG. 8 is a view showing the detailed arrangement of a light-shielded pixel of the image sensor.
Figure 9:
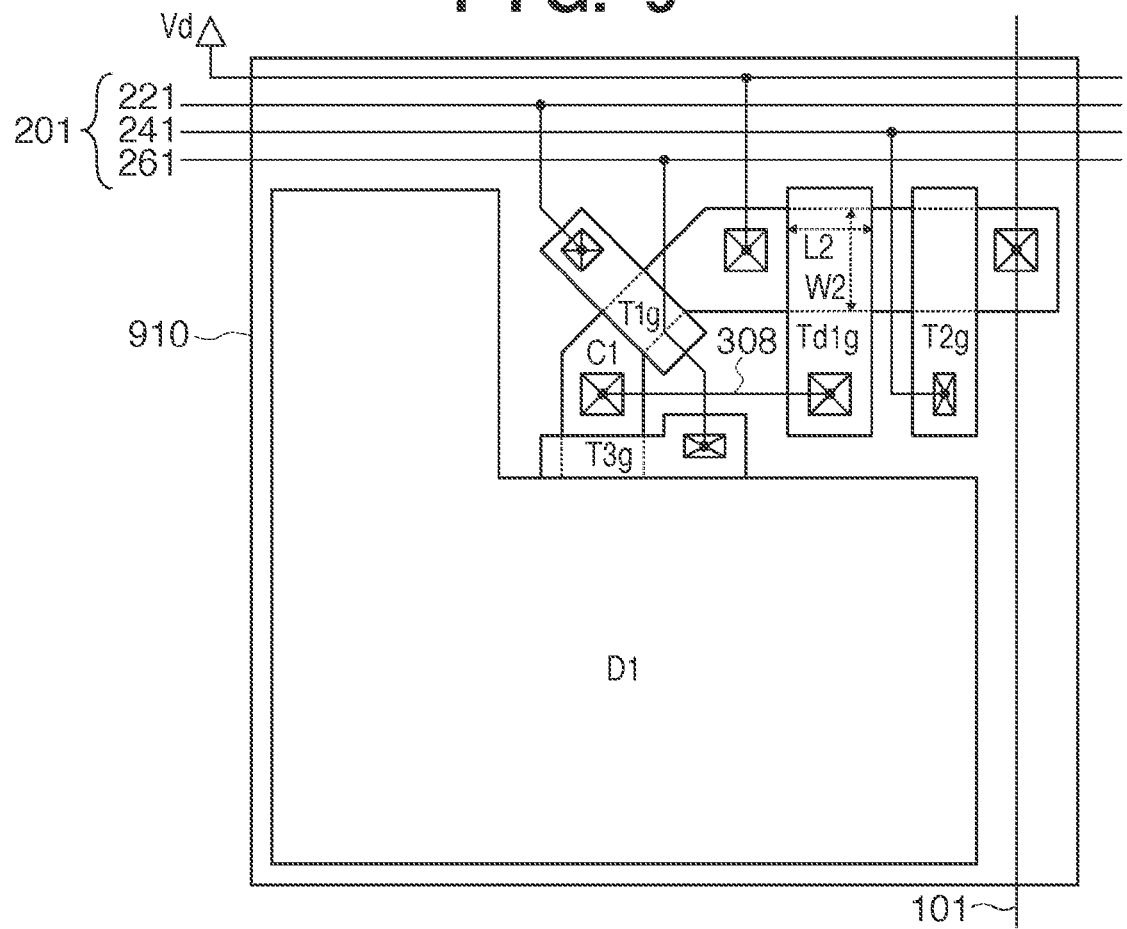
FIG. 9 is a view showing the layout of a light-shielded pixel of the image sensor.

FIG. 8 is a view showing a light-shielded pixel including a photo-electric conversion element. The portion enclosed by the dotted line indicates a light-shielded pixel 91, which has the same arrangement as that of the pixel in FIG. 3 except that it has a light-shielded portion 801. FIG. 9 shows the layout of the first light-shielded pixel including a photo-electric conversion element. The same reference numerals and symbols as in FIG. 8 denote the same components in FIG. 9. The light-shielded portion 801 will not be illustrated, although light is shielded. A cross-section of this arrangement is the same as that shown in FIG. 7. Reference numeral 910 denotes a first light-shielded pixel including a photo-electric conversion element. The lengths of the first light-shielded pixel 910 in the horizontal and vertical directions are the same as those of the photosensitive pixel 110. In addition, the gate width (channel width) and gate length (channel length) of the driving transistor Td1 are respectively represented by W2 and L2.

The following is the operation of the image capturing apparatus in a case in which the first OB region 61 and the second OB region 62 respectively serve as an HOB region and a VOB region, and the first light-shielded pixels 910 are arranged in each region. In the image capturing apparatus according to this embodiment, a preprocessing unit 4 clamps an output signal output from the image sensor 2. At this time, the preprocessing unit 4 can execute VOB clamping by using reference signals for black level read from the second OB region 62 as a VOB region, and execute HOB clamping by using reference signals for black level read from the first OB region 61 as an HOB region.

A signal processing unit 5 generates a one-line correction signal by using the reference signals for black level read from the second OB region 62 as a VOB region, and subtracts the correction signal from an output signal read from the effective pixel region 60, thereby executing vertical streak noise correcting operation (second processing). In addition, the signal processing unit 5 adds and averages the reference signals for black level read from the first OB region 61 as an HOB region, and subtracts the resultant signal from the output signal read from the effective pixel region 60, thus executing digital clamping (first processing).

If, however, the reference signals for black level read from the first OB region 61 as an HOB region include much noise, the HOB clamping operation by the preprocessing unit 4 will generate horizontal streak noise due to erroneous clamping. In addition, the signal processing unit 5 cannot generate accurate reference signals for black level even by digital clamping. As a result, problems such as raising and cutting of signals occur due to erroneous clamping. If the reference signals for black level read from the second OB region 62 as a VOB region include much noise, the preprocessing unit 4 sends erroneously clamped output signals to the signal processing unit 5. In addition, vertical streak noise correcting operation by the signal processing unit 5 using reference signals for black level cannot accurately generate correction signals. As a consequence, vertical streak noise remains. Methods of reducing noise generated by the driving transistors of pixel amplifiers in the OB region in the following three cases will be described.

(1) Case of Reducing Noise Superimposed on Reference Signal for Black Level in HOB Region It is possible to reduce noise generated by the driving transistors Td1 in an HOB region by setting the relationships between the gate width (channel width) W2 and gate length (channel length) L2 of the driving transistor Td1 in the first OB region 61 as an HOB region and the gate width (channel width) W1 and gate length (channel length) L1 of the driving transistor Td1 in the effective pixel region 60 so as to satisfy W2 in first OB region>W1 in effective pixel region and L2 in first OB region>L1 in effective pixel region. This can prevent erroneous clamping.

In this case, even if W2 in first OB region>W1 in effective pixel region and L2 in first OB region=L1 in effective pixel region, some noise reducing effect can be obtained. Even if W2 in first OB region=W1 in effective pixel region and L2 in first OB region>L1 in effective pixel region, some noise reducing effect can be obtained. Furthermore, the gate width (channel width) W2 and gate length (channel length) L2 of the driving transistor Td1 in the second OB region 62 as a VOB region may be set to W2 in second OB region=W1 in effective pixel region and L2 in second OB region=L1 in effective pixel region.

(2) Case of Reducing Noise Superimposed on Reference Signal for Black Level from VOB Region It is possible to reduce noise generated by the driving transistors Td1 in a VOB region by setting the relationships between the gate width (channel width) W2 and gate length (channel length) L2 of the driving transistor Td1 in the second OB region 62 as a VOB region and the gate width (channel width) W1 and gate length (channel length) L1 of the driving transistor Td1 in the effective pixel region 60 so as to satisfy W2 in second OB region>W1 in effective pixel region and L2 in second OB region>L1 in effective pixel region. This can prevent erroneous correction of vertical streak noise.

In this case, even if W2 in second OB region>W1 in effective pixel region and L2 in second OB region=L1 in effective pixel region, some noise reducing effect can be obtained. Even if W2 in second OB region=W1 in effective pixel region and L2 in second OB region>L1 in effective pixel region, some noise reducing effect can be obtained. Furthermore, the gate width (channel width) W2 and gate length (channel length) L2 of the driving transistor Td1 in the first OB region 61 as an HOB region may be set to W2 in first OB region=W1 in effective pixel region and L2 in first OB region=L1 in effective pixel region.

(3) Case of Reducing Noise Superimposed on Reference Signals for Black Level from HOB and VOB Regions It is possible to reduce noise generated by the driving transistors Td1 in HOB and VOB regions to prevent both erroneous clamping and erroneous correction of vertical streak noise by setting the relationships between the gate width (channel width) W2 and gate length (channel length) L2 of the driving transistor Td1 in the first OB region 61 as an HOB region, the gate width (channel width) W2 and gate length (channel length) L2 of the driving transistor Td1 in the second OB region 62 as a VOB region, and the gate width (channel width) W1 and gate length (channel length) L1 of the driving transistor Td1 in the effective pixel region 60 so as to satisfy W2 in first OB region>W1 in effective pixel region, L2 in first OB region>L1 in effective pixel region, W2 in second OB region>W1 in effective pixel region, and L2 in second OB region>L1 in effective pixel region.

In this case, as long as one of W2 and L2 in the first OB region or one of W2 and L2 in the second OB region is equal to W1 or L1 in the effective pixel region, some noise reducing effect can be obtained. Consider a comparison between HOB clamping and vertical streak noise correction. HOB clamping is performed by using not only signals from light-shielded pixels on a row on which clamping is performed but also signals from light-shielded pixels on the preceding row. In contrast, vertical streak noise correction is performed by adding and averaging signals from vertical pixels in a VOB region and using the resultant signal as a correction signal for the corresponding column. Theoretically, therefore, the number of light-shielded pixels which can be used for vertical streak noise correction is smaller than that for HOB clamping. That is, vertical streak noise correction is more susceptible to noise generated by the driving transistors Td1.

In addition, since the effective pixel region in the image sensor is generally longer in the horizontal direction than in the vertical direction, an increase in the VOB region has a greater influence on an increase in the area of the image sensor than an increase in the HOB region. In many cases, therefore, it is difficult to increase the number of light-shielded pixels in the vertical direction. For this reason, it is possible to reduce noise generated by the driving transistors Td1 in a VOB region more by setting W2 in second OB region>W2 in first OB region>W1 in effective pixel region and L2 in second OB region>L2 in first OB region>L1 in effective pixel region. This makes it possible to prevent erroneous correction of vertical streak noise which is sensitive to noise. In this case, as long as one of W2 and L2 in the first OB region or one of W2 and L2 in the second OB region is equal to W1 or L1 in the effective pixel region, some noise reducing effect can be obtained.

Second Embodiment

An image capturing apparatus as the second embodiment of the present invention will be described next with reference to FIG. 10 in addition to FIGS. 1 to 9. Note that the basic arrangement and operation of the image capturing apparatus and the basic arrangement and operation of the image sensor according to this embodiment are the same as those in the first embodiment, and hence will be described by using the same drawings and reference numerals as in the first embodiment.

Figure 10:
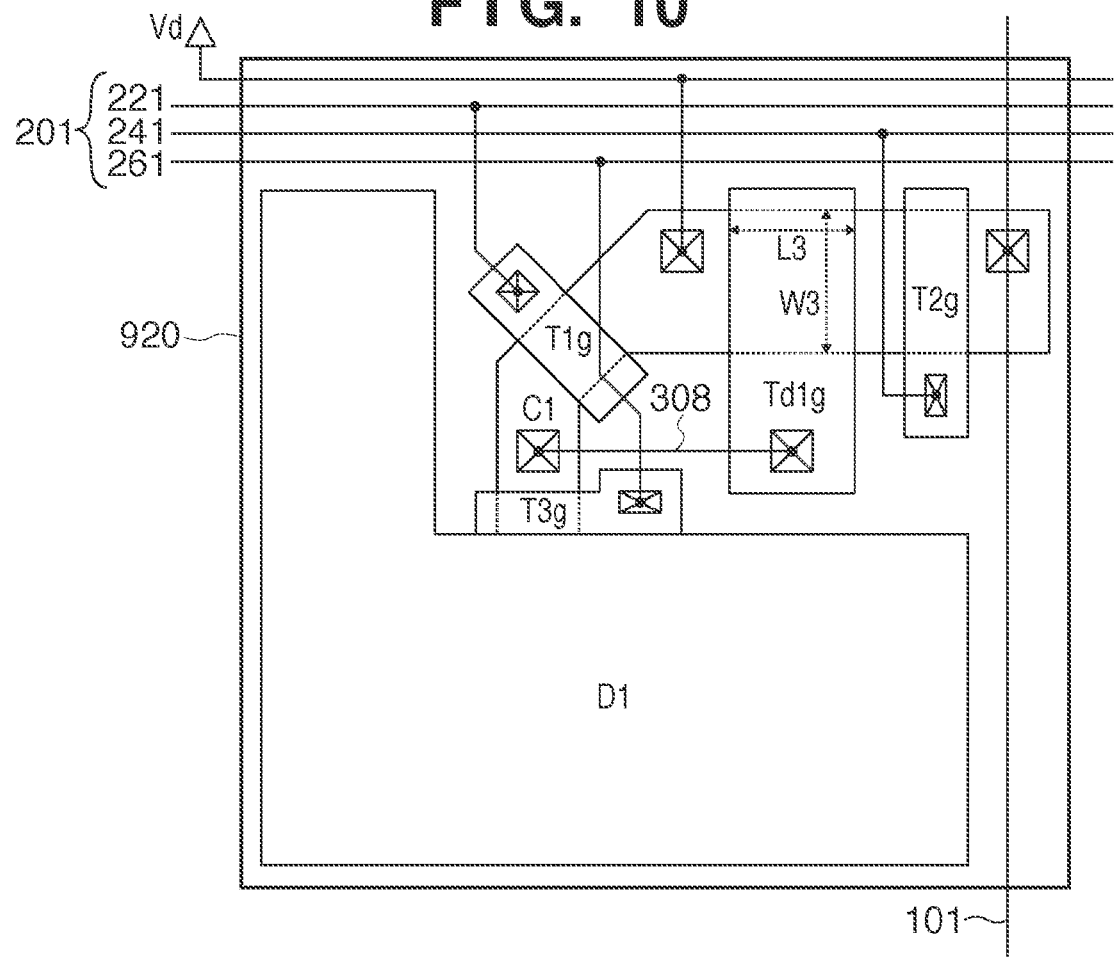
FIG. 10 is a view showing the layout of a light-shielded pixel of the image sensor.

FIG. 10 is a view showing the layout of the second light-shielded pixel including a photo-electric conversion element. The same reference numerals and symbols as in FIG. 8 denote the same components in FIG. 10. A light-shielded portion 801 will not be illustrated, although light is shielded. A cross-section of this arrangement is the same as that shown in FIG. 7. Reference numeral 920 denotes a second light-shielded pixel including a photo-electric conversion element. The lengths of the second light-shielded pixel 920 in the horizontal and vertical directions are the same as those of a photosensitive pixel 110. In addition, the gate width (channel width) and gate length (channel length) of a driving transistor Td1 are respectively represented by W3 and L3.

In the second light-shielded pixel 920, in order to increase the gate width (channel width) W3 and the gate length (channel length) L3, the area of a photo-electric conversion element D1 is reduced. In order to increase the gate width (channel width) W3, the area of the photo-electric conversion element D1 in the vertical direction is reduced. In order to increase the gate length (channel length) L3, the area of the photo-electric conversion element D1 in the horizontal direction is reduced. Note that since the second light-shielded pixel 920 need not be sensitive to light, even a reduction in the area of the photo-electric conversion element D1 will not have much influence on reference signals for black level to be read.

Since the gate width (channel width) W3 and the gate length (channel length) L3 can be set to be large in this manner, it is possible to reduce noise generated by the driving transistor Td1 in the second light-shielded pixel 920 more than in the photosensitive pixel 110. In this case, only the gate width (channel width) W3 may be set to be large, while the gate length (channel length) L3 is set to be equal to L1 of the photosensitive pixel 110 so as not to reduce the area of the photo-electric conversion element D1 in the horizontal direction. Even with this arrangement, some noise reducing effect can be obtained. In addition, only the gate length (channel length) L3 may be set to be large, while the gate width (channel width) W3 is set to be equal to W1 of the photosensitive pixel 110 so as not to reduce the area of the photo-electric conversion element D1 in the vertical direction. Even with this arrangement, some noise reducing effect can be obtained.

The following is the operation of the image capturing operation in a case in which a first OB region 61 and second OB region 62 in FIG. 5 are respectively defined as an HOB region and VOB region.

(1) Case in which Second Light-Shielded Pixels 920 are Arranged in First OB Region 61 and Second OB Region 62

Obviously, it is possible to obtain noise reducing effect by executing operation upon setting the relationships between a gate width (channel width) W1 and gate length (channel length) L1 of an effective pixel region 60 and the gate width (channel width) W3 and gate length (channel length) L3 of each of the first OB region 61 and the second OB region 62 in the same manner as in the first embodiment.

(2) Case in which First Light-Shielded Pixels 910 are Arranged in First OB Region 61 and Second Light-Shielded Pixels 920 are Arranged in Second OB Region 62

Obviously, it is possible to obtain noise reducing effect by executing operation upon setting the relationships between the gate width (channel width) W1 and gate length (channel length) L1 of the effective pixel region 60 and the gate width (channel width) W2 and gate length (channel length) L2 of the first OB region 61 in the same manner as in the first embodiment. Likewise, it is possible to obtain noise reducing effect by executing operation upon setting the relationships between the gate width (channel width) W1 and gate length (channel length) L1 of the effective pixel region 60 and the gate width (channel width) W3 and gate length (channel length) L3 of the second OB region 62 in the same manner as in the first embodiment.

In addition, it is possible to further reduce noise generated by the driving transistors Td1 in a VOB region by setting W3 in second OB region>W2 in first OB region>W1 in effective pixel region and L3 in second OB region>L2 in first OB region>L1 in effective pixel region. This can prevent erroneous correction of vertical streak noise which is sensitive to noise. In this case, as long as one of W2 and L2 in the first OB region or one of W3 and L3 in the second OB region is equal to W1 or L1 in the effective pixel region, some noise reducing effect can be obtained.

Obviously, it is possible to obtain noise reducing effect even if the second light-shielded pixels 920 are arranged in the first OB region 61, and the first light-shielded pixels 910 are arranged in the second OB region 62, as in case (2) in this embodiment. In addition, in the embodiment, in order to increase the gate width (channel width) W3, the area of the photo-electric conversion element D1 in the vertical direction is reduced. In order to increase the gate length (channel length) L3, the area of the photo-electric conversion element D1 in the horizontal direction is reduced. However, as long as the area of the photo-electric conversion element D1 in the vertical direction is reduce to increase the gate width (channel width) W and the gate length (channel length) L, it is possible to reverse the combinations of the directions in which the area of the photo-electric conversion element D1 is reduced horizontally and vertically and the direction (the horizontal direction or the vertical direction) in which the gate width (channel width) W and the gate length (channel length) L are increased, depending on the layout of the driving transistor Td1.

Third Embodiment

An image capturing apparatus as the third embodiment of the present invention will be described next with reference to FIGS. 11 to 13 in addition to FIGS. 1 to 10. Note that the basic arrangement and operation of the image capturing apparatus and the basic arrangement and operation of the image sensor according to this embodiment are the same as those in the first and second embodiments, and hence will be described by using the same drawings and reference numerals as in the first and second embodiments.

Figure 11:
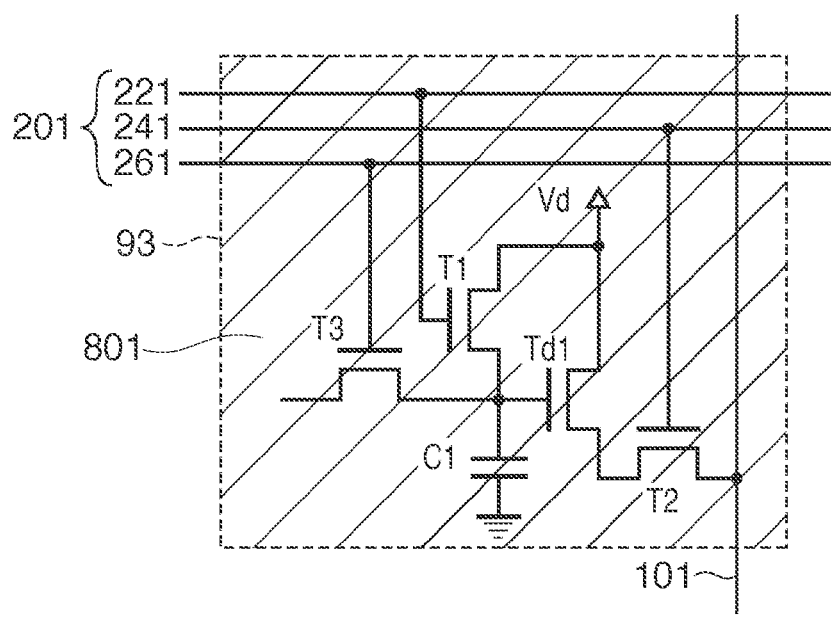
FIG. 11 is a view showing the detailed arrangement of a light-shielded pixel of the image sensor.
Figure 12:
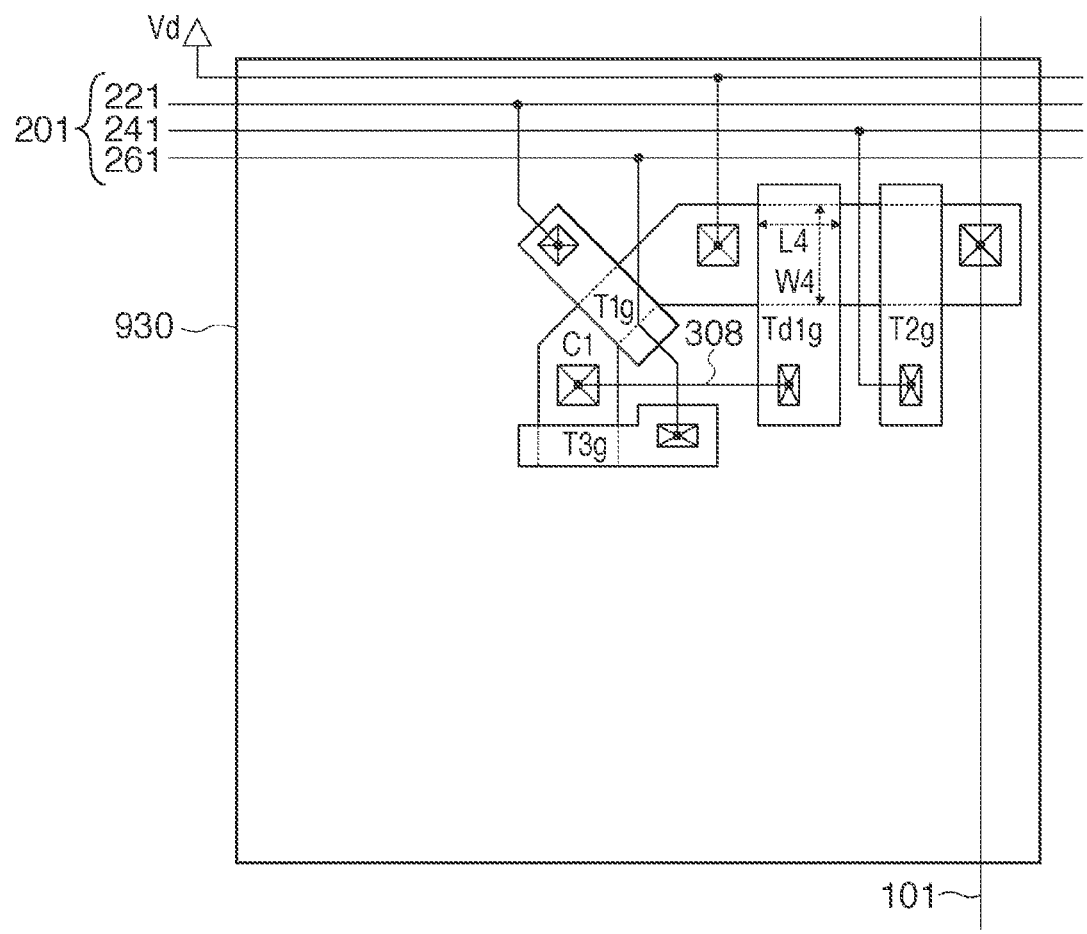
FIG. 12 is a view showing the layout of a light-shielded pixel of the image sensor.

FIG. 11 is a view showing a light-shielded pixel including no photo-electric conversion element. The portion enclosed by the dotted line indicates a light-shielded pixel 93. This pixel is characterized by having a light-shielded portion 801 and having no photo-electric conversion element D1. Except for this characteristic, the pixel has the same arrangement as that of the pixel in FIG. 3. FIG. 12 shows the layout of a third light-shielded pixel including no photo-electric conversion element. This layout is equivalent to the layout in FIG. 9 from which the photo-electric conversion element D1 is omitted. The same reference numerals and symbols as in FIG. 9 denote the same components in FIG. 11. The light-shielded portion 801 will not be illustrated, although light is shielded. A cross-section of this arrangement is the same as that shown in FIG. 7 except that it does not include the photo-electric conversion element D1 denoted by reference numeral 301 in FIG. 7. Reference numeral 930 denotes a third light-shielded pixel including no photo-electric conversion element. The lengths of the third light-shielded pixel 930 in the horizontal and vertical directions are the same as those of a photosensitive pixel 110. In addition, the gate width (channel width) and gate length (channel length) of a driving transistor Td1 are respectively represented by W4 and L4.

Figure 13:
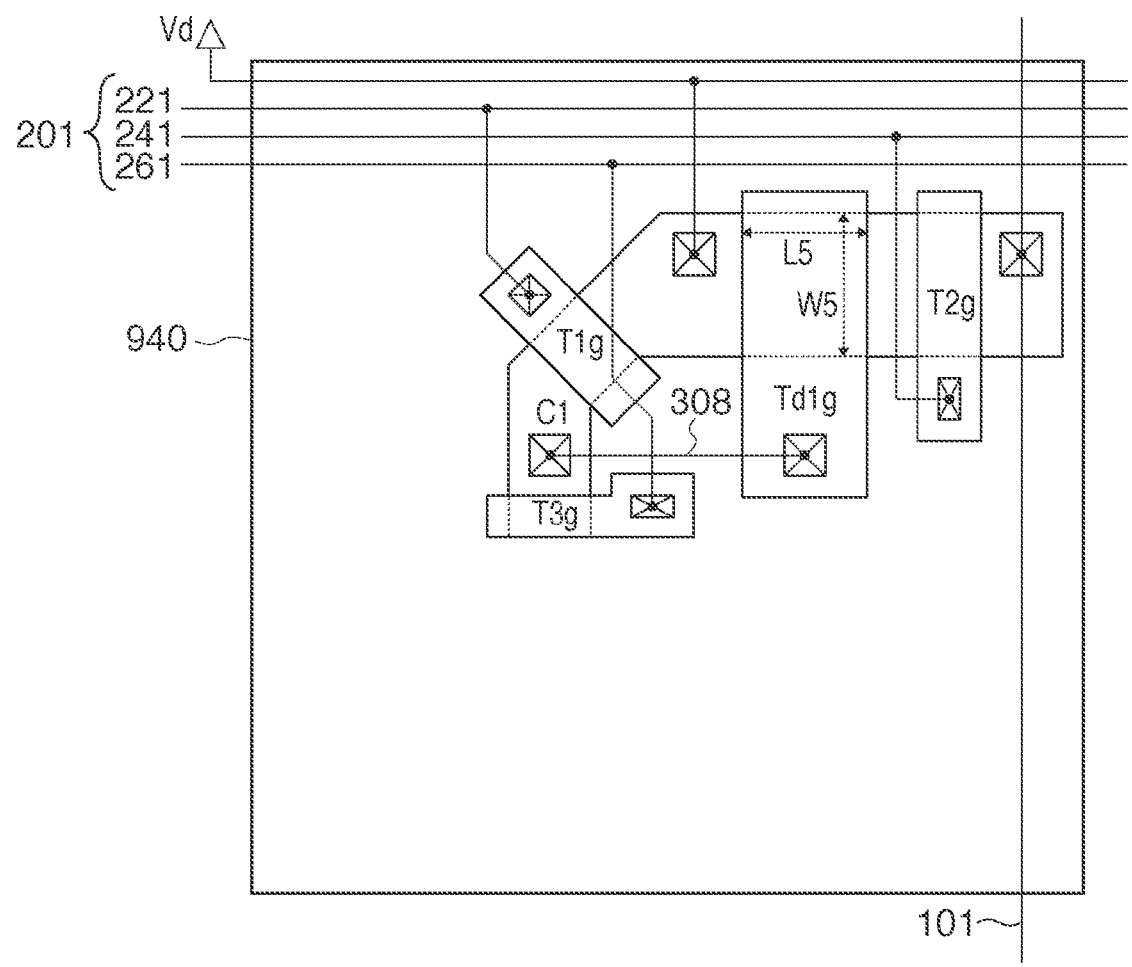
FIG. 13 is a view showing the layout of a light-shielded pixel of the image sensor.

FIG. 13 shows the layout of the fourth light-shielded pixel including no photo-electric conversion element. This layout is equivalent to the layout in FIG. 10 from which the photo-electric conversion element D1 is omitted. The same reference numerals and symbols as in FIG. 11 denote the same components in FIG. 13. The light-shielded portion 801 will not be illustrated, although light is shielded. A cross-section of this arrangement is the same as that shown in FIG. 7 except that it does not include the photo-electric conversion element D1 denoted by reference numeral 301 in FIG. 7. Reference numeral 940 denotes a fourth light-shielded pixel including no photo-electric conversion element. The lengths of the fourth light-shielded pixel 940 in the horizontal and vertical directions are the same as those of the photosensitive pixel 110. In addition, the gate width (channel width) and gate length (channel length) of a driving transistor Td1 are respectively represented by W5 and L5.

The layout of the fourth light-shielded pixel 940 is designed to increase the gate width (channel width) W5 and the gate length (channel length) L5 by the same method as that in FIG. 10 by which the area of the photo-electric conversion element D1 is reduced. As described above, in the third light-shielded pixel 930 and the fourth light-shielded pixel 940, since gate widths (channel widths) W and gate lengths (channel lengths) L can be set to be large, it is possible to reduce noise generated by the driving transistors Td1 in the third light-shielded pixel 930 and fourth light-shielded pixel 940 more than in the photosensitive pixel 110. In this case, only a gate width (channel width) W3 may be increased while a gate length (channel length) L3 is set to be equal to L1 of the photosensitive pixel 110. Even with this arrangement, some noise reducing effect can be obtained. In addition, only the gate length (channel length) L3 may be increased while the gate width (channel with) W3 is set to be equal to W1 of the photosensitive pixel 110. Even with this arrangement, some noise reducing effect can be obtained. In this case, since the third light-shielded pixel 930 and the fourth light-shielded pixel 940 include no photo-electric conversion elements D1, they are free from the influence of the dark currents generated by the photo-electric conversion elements D1. For this reason, noise in readout reference signals for black level in these pixels are much smaller than those in a first light-shielded pixel 910 and a second light-shielded pixel 920.

The following is the operation of the image capturing operation in a case in which a first OB region 61 and second OB region 62 in FIG. 5 are respectively defined as an HOB region and VOB region.

(1) Case in which First Light-Shielded Pixels 910 are Arranged in First OB Region 61 and Third Light-Shielded Pixels 930 are Arranged in Second OB Region 62

Obviously, it is possible to obtain noise reducing effect by executing operation upon setting the relationships between a gate width (channel width) W1 and gate length (channel length) L1 of an effective pixel region 60 and a gate width (channel width) W2 and gate length (channel length) L2 of the first OB region 61 in the same manner as in the first embodiment. Likewise, obviously, it is possible to obtain noise reducing effect by executing operation upon setting the relationships between the gate width (channel width) W1 and gate length (channel length) L1 of the effective pixel region 60 and a gate width (channel width) W4 and gate length (channel length) L4 of the second OB region 62 in the same manner as in the first embodiment. In this case, since the third light-shielded pixels 930 arranged in the VOB region include no photo-electric conversion elements D1, reference signals for black level read from the third light-shielded pixels 930 do not contain much noise as compared with the first light-shielded pixels 910. This arrangement is therefore effective for vertical streak noise correction which is sensitive to noise.

In addition, it is possible to further reduce noise generated by the driving transistors Td1 in a VOB region by setting W4 in second OB region>W2 in first OB region>W1 in effective pixel region and L4 in second OB region>L2 in first OB region>L1 in effective pixel region. This can further prevent erroneous correction of vertical streak noise which is sensitive to noise. In this case, as long as one of W2 and L2 in the first OB region or one of W4 and L4 in the second OB region is equal to W1 or L1 in the effective pixel region, some noise reducing effect can be obtained.

It is also obvious that noise reducing effect can be obtained in both case in which the second light-shielded pixels 920 are arranged in the first OB region 61 and the case in which the fourth light-shielded pixels 940 are arranged in the second OB region 62, as in case (1) in this embodiment. Furthermore, as long as the gate width (channel width) W and the gate length (channel length) L can be increased, it is possible to reverse the combination of the directions (the horizontal direction and the vertical direction) in which the gate width (channel width) W and the gate length (channel length) L are increased, depending on the layout of the driving transistor Td1.

Fourth Embodiment

An image capturing apparatus as the fourth embodiment of the present invention will be described next with reference to FIGS. 14A to 14E in addition to FIGS. 1 to 13. Note that the basic arrangement and operation of the image capturing apparatus and the basic arrangement and operation of the image sensor according to this embodiment are the same as those in the first to third embodiments, and hence will be described by using the same drawings and reference numerals as in the first to third embodiments.

Figure 14A:
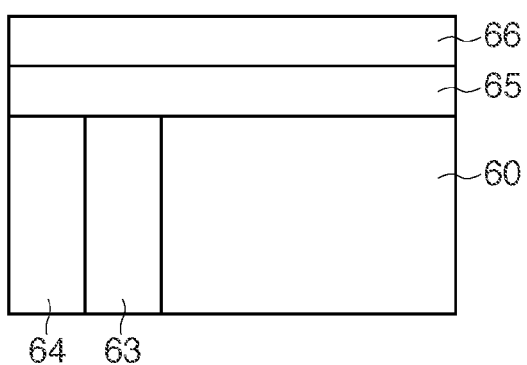
FIGS. 14A to 14E are views each showing the pixel array of the image sensor.

FIG. 14A is an example of a view showing the pixel array of an image sensor 2 in this embodiment. Reference numeral 60 denotes an effective pixel region in which photosensitive pixels 110 including photo-electric conversion elements are arranged; and 63, 64, 65, and 66, third, fourth, fifth, and sixth OB regions in which light-shielded pixels are arranged. The following is the operation of the image capturing operation in a case in which the third, fourth, fifth, and sixth OB regions 63, 64, 65, and 66 are respectively defined as the first HOB region, the second HOB region, the first VOB region, and the second VOB region.

In the image capturing apparatus according to this embodiment, a preprocessing unit 4 clamps the output signal output from the image sensor 2. At this time, the preprocessing unit 4 executes VOB clamping by using reference signals for black level read from the sixth OB region 66 as the second VOB region, and executes HOB clamping by using reference signals for black level read from the fourth OB region 64 as the second HOB region. At this time, the preprocessing unit 4 may execute VOB clamping by additionally using signals read from the fifth OB region 65 as the first VOB region, and may execute HOB clamping by additionally using signals read from the third OB region 63 as the first HOB region. A signal processing unit 5 generates a one-line correction signal by using the reference signals for black level read from the fifth OB region 65 as the first VOB region, and subtracts the correction signal from the output signal read from the effective pixel region 60 and the third OB region 63 as the first HOB region, thereby executing vertical streak noise correcting operation.

In addition, the signal processing unit 5 adds and averages the reference signals for black level read from the third OB region 63 as the first HOB region and having undergone vertical streak noise correction, and subtracts the resultant signal from the output signal read from the effective pixel region 60, thus executing digital clamping. As is obvious from the first to third embodiments, this operation has the effect of reducing noise generated by the driving transistors Td1 as compared with the photosensitive pixels 110 regardless of whether first light-shielded pixels 910, second light-shielded pixels 920, third light-shielded pixels 930, or fourth light-shielded pixels 940 are arranged in the third OB region 63, fourth OB region 64, fifth OB region 65, and sixth OB region 66.

However, light-shielded pixels including photo-electric conversion elements and light-shielded pixels including no photo-electric conversion elements surround the effective pixel region 60 in which photosensitive pixels including photo-electric conversion elements are arranged, and hence a more suitable arrangement of light-shielded pixels is desired. For example, digital clamping executed by the signal processing unit 5 can use the signal obtained by adding and averaging reference signals for black level from the entire third OB region 63. In contrast to this, when executing HOB clamping by using the fourth OB region 64, the preprocessing unit 4 performs clamping operation including reference pixels for black level read from a line before a line on which clamping is performed. For this reason, the number of light-shielded pixels which can be used for HOB clamping is smaller than that for digital clamping. That is, HOB clamping is more susceptible to noise generated by the driving transistors Td1. It is therefore preferable to make the gate width (channel width) W and gate length (channel length) L in the fourth OB region 64 larger than those of the third OB region 63.

It is only necessary for VOB clamping executed by the preprocessing unit 4 to be complete before signals are read from the effective pixel region 60. It is therefore possible to perform clamping operation by using signals from the reference pixels for black level in the entire sixth OB region 66. In contrast, vertical streak noise correction using the fifth OB region 65, which is executed by the signal processing unit 5, uses the value obtained by adding and averaging signals from vertical pixels in the fifth OB region 65 as a correction signal for the corresponding column. For this reason, the number of light-shielded pixels which can be used for vertical streak noise correction is smaller than that for VOB clamping. That is, vertical streak noise correction is more susceptible to noise generated by the driving transistors Td1. It is therefore preferable to make the gate width (channel width) W and gate length (channel length) L in the fifth OB region 65 larger than those of the sixth OB region 66. Conditions for light-shielded pixels arranged in OB regions will be described below.

(1) Case in which First Light-Shielded Pixels 910, Second Light-Shielded Pixels 920, Third Light-Shielded Pixels 930, or Fourth Light-Shielded Pixels 940 are Arranged in Both Third OB Region 63 and Fourth OB Region 64 as HOB regions In this case, it is possible to further reduce noise generated by the driving transistors Td1 in the fourth OB region 64 by setting conditions for the gate widths (channel widths) W and gate lengths (channel lengths) L in the third OB region and fourth OB region so as to satisfy W in fourth OB region>W in third OB region>W1 in effective pixel region and L in fourth OB region>L in third OB region>L1 in effective pixel region. This can further prevent erroneous correction of HOB clamping which is sensitive to noise.

(2) Case in which Two Sets of First Light-Shielded Pixels 910, Second Light-Shielded Pixels 920, Third Light-Shielded Pixels 930, and Fourth Light-Shielded Pixels 940 are Arranged in Combination in Third OB Region 63 and Fourth OB Region 64

When the third OB region 63 includes the first light-shielded pixels 910, the second light-shielded pixels 920, the third light-shielded pixels 930, or the fourth light-shielded pixels 940 are arranged in the fourth OB region 64. This allows to increase the gate width (channel width) W and gate length (channel length) L as compared with the first light-shielded pixel 910, and hence can satisfy the conditions for case (1) in this embodiment.

Likewise, when the third OB region 63 includes the second light-shielded pixels 920, the third light-shielded pixels 930 or the fourth light-shielded pixels 940 are arranged in the fourth OB region 64. In addition, when the third OB region 63 includes the third light-shielded pixels 930, the fourth light-shielded pixels 940 are arranged in the fourth OB region 64. This can satisfy the condition for case (1) in the embodiment. This makes it possible to further reduce noise generated by the driving transistors Td1 in the fourth OB region 64, and hence can further prevent erroneous correction of HOB clamping which is sensitive to noise.

(3) Case in which First Light-Shielded Pixels 910, Second Light-Shielded Pixels 920, Third Light-Shielded Pixels 930, or Fourth Light-Shielded Pixels 940 are Arranged in Both Fifth OB Region 65 and Sixth OB Region 66 as VOB Regions It is possible to reduce noise generated by the driving transistors Td1 in the fifth OB region 65 more by setting conditions for the gate widths (channel widths) W and gate lengths (channel lengths) L in the fifth OB region and sixth OB region so as to satisfy W in fifth OB region>W in sixth OB region>W1 in effective pixel region and L in fifth OB region>L in sixth OB region>L1 in effective pixel region. This can further prevent erroneous correction of vertical streak noise which is sensitive to noise.

(4) Case in which Two Sets of First Light-Shielded Pixels 910, Second Light-Shielded Pixels 920, Third Light-Shielded Pixels 930, and Fourth Light-Shielded Pixels 940 are Arranged in Combination in Fifth OB Region 65 and Sixth OB Region 66 as VOB Regions When the sixth OB region 66 includes the first light-shielded pixels 910, the second light-shielded pixels 920, the third light-shielded pixels 930, or the fourth light-shielded pixels 940 are arranged in the fifth OB region 65. This allows to increase the gate width (channel width) W and gate length (channel length) L as compared with the first light-shielded pixel 910, and hence can satisfy the conditions for case (1) in this embodiment.

Likewise, when the sixth OB region 66 includes the second light-shielded pixels 920, the third light-shielded pixels 930 or the fourth light-shielded pixels 940 are arranged in the fifth OB region 65. In addition, when the sixth OB region 66 includes the third light-shielded pixels 930, the fourth light-shielded pixels 940 are arranged in the fifth OB region 65. This can satisfy the condition for case (1) in the embodiment. This makes it possible to further reduce noise generated by the driving transistors Td1 in the fifth OB region 65, and hence can further prevent erroneous correction of vertical streak noise which is sensitive to noise.

A case in which conditions for an HOB region and conditions for a VOB region are combined will be described below. Consider a comparison between HOB clamping and vertical streak noise correction. HOB clamping is performed by using not only signals from light-shielded pixels on a row on which clamping is performed but also signals from light-shielded pixels on the preceding row. In contrast, vertical streak noise correction is performed by adding and averaging signals from vertical pixels in a VOB region and using the resultant signal as a correction signal for the corresponding column. Theoretically, therefore, the number of light-shielded pixels which can be used for vertical streak noise correction is smaller than that for HOB clamping. That is, vertical streak noise correction is more susceptible to noise generated by the driving transistors Td1. For this reason, it is possible to reduce noise generated by the driving transistors Td1 in the fifth VOB region 65 more by setting W in fifth OB region>W in fourth OB region>W1 in effective pixel region and L in fifth OB region>L in fourth OB region>L1 in effective pixel region. This makes it possible to prevent erroneous correction of vertical streak noise which is sensitive to noise.

Consider a comparison between VOB clamping and HOB clamping. It is only necessary for VOB clamping to be complete before signals are read from the effective pixel region. It is therefore possible to perform VOB clamping by using signals from the reference pixels for black level in the entire VOB region. In contrast, HOB clamping is performed by using not only signals from light-shielded pixels on a row on which clamping is performed but also signals from light-shielded pixels on the preceding row. Therefore, the number of light-shielded pixels which can be used for HOB clamping is smaller than that for VOB clamping. That is, HOB clamping is more susceptible to noise generated by the driving transistors Td1.

For this reason, it is possible to reduce noise generated by the driving transistors Td1 in the fourth OB region 64 more by setting W in fourth OB region>W in sixth OB region>W1 in effective pixel region and L in fourth OB region>L in sixth OB region>L1 in effective pixel region. This makes it possible to prevent erroneous HOB clamping which is sensitive to noise. Although there will be no specific description of a comparison between the noise sensitivity of VOB clamping and that of digital clamping, it is possible to set some difference between the gate width (channel width) W and the gate length (channel length) L of the driving transistor Td1 depending on the manner of use.

In addition, digital clamping is performed by adding and averaging reference signals for black level read from an HOB region and subtracting the resultant signal from an output signal read from the effective pixel region as a reference for black level of the output signal read from the effective pixel region. For this reason, it is sometimes convenient to output the same signals as those from effective pixels during a dark time. This can be implemented by arranging the light-shielded pixels 910, which are structurally the same as the photosensitive pixels 110 arranged in the effective pixel region 60 except for light-shielded portions 801, in the third OB region 63, and setting W2 in third OB region=W1 in effective pixel region and L2 in third OB region=L1 in effective pixel region.

A modification of this embodiment will be described next. FIG. 14B is a view showing a modification of the pixel array of the image sensor 2 in this embodiment. Reference numeral 60 denotes an effective pixel region in which the photosensitive pixels 110 including photo-electric conversion elements are arranged; and 63, 64, and 67, a third OB region, fourth OB region, and seventh OB region, respectively, in which light-shielded pixels are arranged. As is obvious from the first to third embodiments, this arrangement has the effect of reducing noise generated by the driving transistors Td1 as compared with the photosensitive pixels 110 regardless of whether the first light-shielded pixels 910, second light-shielded pixels 920, third light-shielded pixels 930, or fourth light-shielded pixels 940 are arranged in the third OB region 63, fourth OB region 64, and seventh OB region 67.

Furthermore, the third OB region 63, fourth OB region 64, and seventh OB region 67 are respectively defined as the first HOB region, second HOB region, and third VOB region. It is possible to reduce noise generated by the driving transistors Td1 in the fourth OB region 64 more by arranging light-shielded pixels in the third OB region 63 and fourth OB region 64 so as to satisfy conditions (1) and (2) for the HOB region in this embodiment, and making the seventh OB region 67 operate in the same manner as the VOB region in the first embodiment. This makes it possible to further prevent erroneous correction of HOB clamping which is sensitive to noise.

Figure 14D:
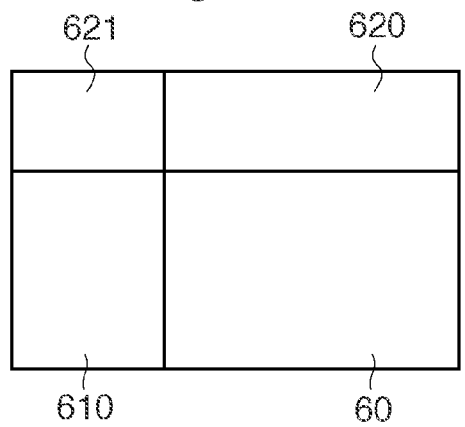
Figure 14B:
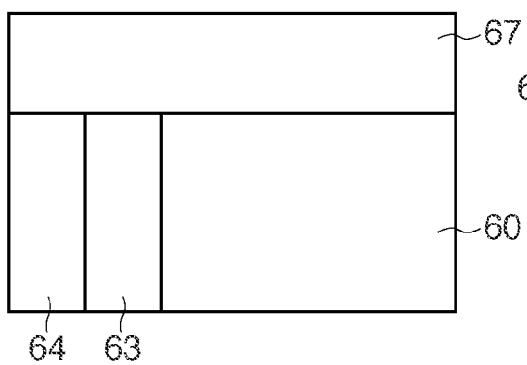
Figure 14E:
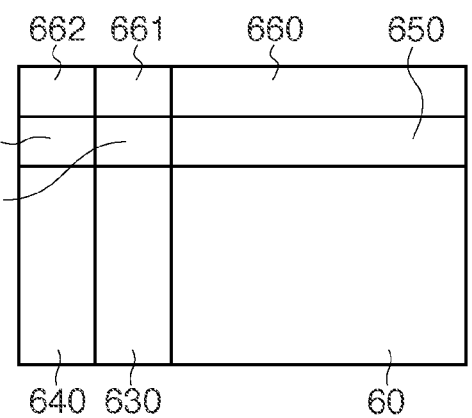
Figure 14C:
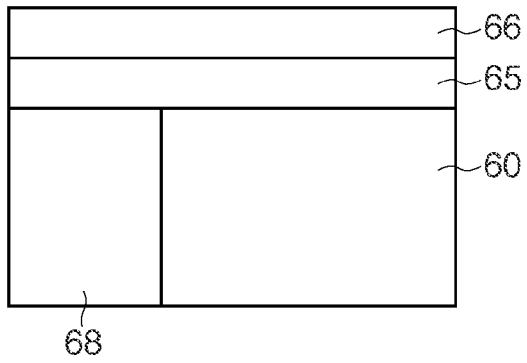

FIG. 14C is a view showing another modification of the pixel array of the image sensor 2 in this embodiment. Reference numeral 60 denotes an effective pixel region in which the photosensitive pixels 110 including photo-electric conversion elements are arranged; and 65, 66, and 68, a fifth OB region, sixth OB region, and eighth OB region, respectively, in which light-shielded pixels are arranged. As is obvious from the first to third embodiments, this arrangement has the effect of reducing noise generated by the driving transistors Td1 as compared with the photosensitive pixels 110 regardless of whether the first light-shielded pixels 910, second light-shielded pixels 920, third light-shielded pixels 930, or fourth light-shielded pixels 940 are arranged in the fifth OB region 65, sixth OB region 66, and eighth OB region 68.

Furthermore, the fifth OB region 65, sixth OB region 66, and eighth OB region 68 are respectively defined as the first VOB region, second VOB region, and third HOB region. It is possible to reduce noise generated by the driving transistors Td1 in the fifth OB region 65 more by arranging light-shielded pixels in the fifth OB region 65 and sixth OB region 66 so as to satisfy conditions (3) and (4) for the VOB regions in this embodiment, and making the eighth OB region 68 operate in the same manner as the HOB region in the first embodiment. This makes it possible to further prevent erroneous correction of vertical streak noise which is sensitive to noise.

FIG. 14D is a view showing a modification of the pixel array in FIG. 5. Reference numeral 60 denotes an effective pixel region in which the photosensitive pixels 110 including photo-electric conversion elements are arranged; and 610, 620, and 621, OB regions, respectively, in which light-shielded pixels are arranged. As is obvious from the first to third embodiments, this arrangement has the effect of reducing noise generated by the driving transistors Td1 as compared with the photosensitive pixels 110 regardless of whether the first light-shielded pixels 910, second light-shielded pixels 920, third light-shielded pixels 930, or fourth light-shielded pixels 940 are arranged in the OB regions 610, 620, and 621. In addition, referring to FIG. 14D, the second OB region 62 as the VOB region having the pixel array in FIG. 5 is segmented into the OB regions 620 and 621 in accordance with the width of the HOB region. Although the OB region 620 is made to operate in the same manner as the VOB region in the first embodiment, the OB region 621 may be used as either an HOB region or a VOB region or may serve as both an HOB region and a VOB region.

FIG. 14E is a view showing a modification of the pixel array in FIG. 14A. Reference numeral 60 denotes an effective pixel region in which the photosensitive pixels 110 including photo-electric conversion elements are arranged; and 630, 640, 650, 651, 652, 660, 661, and 662, OB regions, respectively, in which light-shielded pixels are arranged. As is obvious from the first to third embodiments, this arrangement has the effect of reducing noise generated by the driving transistors Td1 as compared with the photosensitive pixels 110 regardless of whether the first light-shielded pixels 910, second light-shielded pixels 920, third light-shielded pixels 930, or fourth light-shielded pixels 940 are arranged in the OB regions 630, 640, 650, 651, 652, 660, 661, and 662.

In addition, referring to FIG. 14E, the fifth OB region 65 and the sixth OB region 66 as the VOB regions having the pixel array in FIG. 14A are segmented into the OB regions 650, 651, 652, 660, 661, and 662 in accordance with the width of the HOB region. Although the OB regions 630, 640, 650, and 660 are made to operate in the same manner as the first HOB region, second HOB region, first VOB region, and second VOB region, the OB regions 651, 652, 661, and 662 may be used as either HOB regions or VOB regions or may serve as both HOB regions and VOB regions.

Fifth Embodiment

Figure 15A:
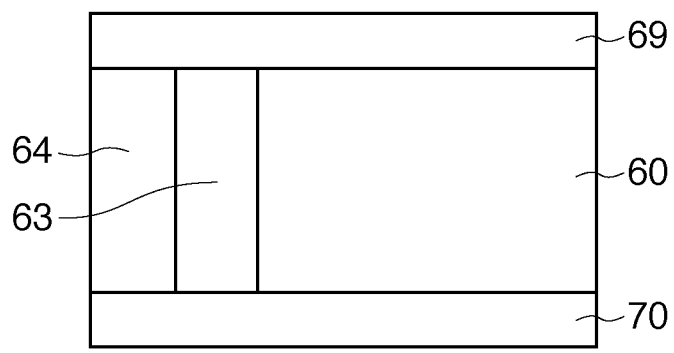
FIGS. 15A to 15C are views each showing the pixel array of the image sensor.
Figure 15B:
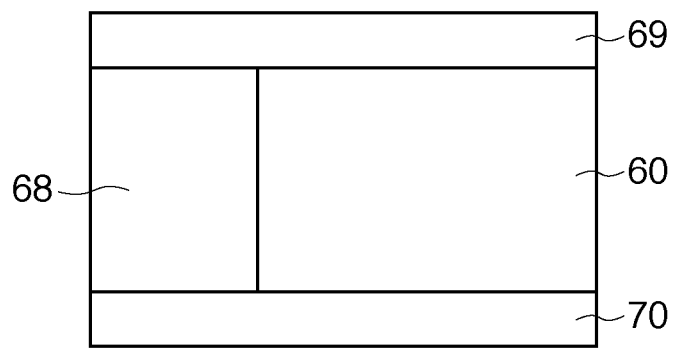

An image capturing apparatus as the fifth embodiment of the present invention will be described next with reference to FIGS. 15A to 15C in addition to FIGS. 14A to 14E. Note that the basic arrangement and operation of the image capturing apparatus and the basic arrangement and operation of the image sensor according to this embodiment are the same as those in the first to fourth embodiments, and hence will be described by using the same drawings and reference numerals as in the first to fourth embodiments. FIG. 15A is an example of a view showing the pixel array of an image sensor 2 in this embodiment. Reference numeral 60 denotes an effective pixel region in which photosensitive pixels 110 including photo-electric conversion elements are arranged; and 63, 64, 69, and 70, third, fourth, ninth, and 10th OB regions in which light-shielded pixels are arranged. The following is the operation of the image capturing operation in a case in which the third, fourth, ninth, and 10th OB regions 63, 64, 69, and 70 are respectively defined as the first HOB region, second HOB region, fourth VOB region, and fifth VOB region.

In the image capturing apparatus according to this embodiment, a preprocessing unit 4 clamps an output signal output from an image sensor 2. At this time, the preprocessing unit 4 executes VOB clamping by using reference signals for black level read from the ninth OB region 69 as the fourth VOB region, and executes HOB clamping by using reference signals for black level read from the fourth OB region 64 as the second HOB region. At this time, the preprocessing unit 4 may execute HOB clamping by additionally using signals read from the third OB region 63 as the first HOB region. A signal processing unit 5 generates a one-line correction signal by using the reference signals for black level read from the 10th OB region 70 as the fifth VOB region, and subtracts the correction signal from the output signal read from the effective pixel region 60 and the third OB region 63 as the first HOB region, thereby executing vertical streak noise correcting operation. In this case, in the pixel array of the image sensor 2 in FIG. 15A, since the 10th OB region 70 as the fifth VOB region is located under the effective pixel region 60, vertical streak noise correction is performed for the next captured image.

In addition, the signal processing unit 5 adds and averages the reference signals for black level read from the third OB region 63 as the first HOB region, and subtracts the resultant signal from the output signal read from the effective pixel region 60, thus executing digital clamping. As is obvious from the first to third embodiments, this operation has the effect of reducing noise generated by the driving transistors Td1 as compared with the photosensitive pixels 110 regardless of whether first light-shielded pixels 910, second light-shielded pixels 920, third light-shielded pixels 930, or fourth light-shielded pixels 940 are arranged in the third OB region 63, fourth OB region 64, ninth OB region 69, and 10th OB region 70.

However, as in the fourth embodiment, light-shielded pixels including photo-electric conversion elements and light-shielded pixels including no photo-electric conversion elements surround the effective pixel region 60 in which photosensitive pixels including photo-electric conversion elements are arranged, and hence a more suitable arrangement of light-shielded pixels is desired. The operation using the light-shielded pixels in the VOB regions and the operation using the light-shielded pixels in the HOB regions are the same as those in the fourth embodiment except that the ninth OB region 69 and the 10th OB region 70 are replaced with the sixth OB region 66 and the fifth OB region 65, respectively. Therefore, only conditions for light-shielded pixels arranged in each OB region will be described below.

(1) Case in which First Light-Shielded Pixels 910, Second Light-Shielded Pixels 920, Third Light-Shielded Pixels 930, or Fourth Light-Shielded Pixels 940 are Arranged in Both Third OB Region 63 and Fourth OB Region 64 as HOB Regions, as in Fourth Embodiment In this case, it is possible to reduce noise generated by the driving transistors Td1 in the fourth OB region 64 more by setting conditions for gate widths (channel widths) W and gate lengths (channel lengths) L in the third and fourth OB regions so as to satisfy W in fourth OB region>W in third OB region>W1 in effective pixel region and L in fourth OB region>L in third OB region>L1 in effective pixel region. This makes it possible to further prevent erroneous correction of HOB clamping which is sensitive to noise.

(2) Case in which Two Sets of First Light-Shielded Pixels 910, Second Light-Shielded Pixels 920, Third Light-Shielded Pixels 930, and Fourth Light-Shielded Pixels 940 are Arranged in Combination in Third OB Region 63 and Fourth OB Region 64 as HOB Regions, as in Fourth Embodiment When the third OB region 63 includes the first light-shielded pixels 910, the second light-shielded pixels 920, the third light-shielded pixels 930, or the fourth light-shielded pixels 940 are arranged in the fourth OB region 64. This allows to increase the gate width (channel width) W and gate length (channel length) L as compared with the first light-shielded pixel 910, and hence can satisfy the conditions for "(1)" in this embodiment. Likewise, when the third OB region 63 includes the second light-shielded pixels 920, the third light-shielded pixels 930 or the fourth light-shielded pixels 940 are arranged in the fourth OB region 64. In addition, when the third OB region 63 includes the third light-shielded pixels 930, the fourth light-shielded pixels 940 are arranged in the fourth OB region 64. This can satisfy the conditions for "(1)" in this embodiment. This can reduce noise generated by the driving transistors Td1 in the fourth OB region 64 more, and hence can further prevent erroneous correction of HOB clamping which is sensitive to noise.

(3) Case in which First Light-Shielded Pixels 910, Second Light-Shielded Pixels 920, Third Light-Shielded Pixels 930, or Fourth Light-Shielded Pixels 940 are Arranged in Both Ninth OB Region 69 and 10th OB Region 70 as VOB Regions In this case, it is possible to reduce noise generated by the driving transistors Td1 in the 10th OB region 70 more by setting conditions for the gate widths (channel widths) W and gate lengths (channel lengths) L in the ninth OB region and 10th OB region so as to satisfy W in 10th OB region>W in ninth OB region>W1 in effective pixel region and L in 10th OB region>L in ninth OB region>L1 in effective pixel region. This can further prevent erroneous correction of vertical streak noise which is sensitive to noise.

(4) Case in which Two Sets of First Light-Shielded Pixels 910, Second Light-Shielded Pixels 920, Third Light-Shielded Pixels 930, and Fourth Light-Shielded Pixels 940 are Arranged in Combination in Ninth OB Region 69 and 10th OB Region 70 as VOB Regions When the ninth OB region 69 includes the first light-shielded pixels 910, the second light-shielded pixels 920, the third light-shielded pixels 930, or the fourth light-shielded pixels 940 are arranged in the 10th OB region 70. This allows to increase the gate width (channel width) W and gate length (channel length) L as compared with the first light-shielded pixel 910, and hence can satisfy the conditions for "(1)" in this embodiment. Likewise, when the ninth OB region 69 includes the second light-shielded pixels 920, the third light-shielded pixels 930 or the fourth light-shielded pixels 940 are arranged in the 10th OB region 70. In addition, when the ninth OB region 69 includes the third light-shielded pixels 930, the fourth light-shielded pixels 940 are arranged in the 10th OB region 70. This can satisfy the conditions for "(1)" in this embodiment.

This can reduce noise generated by the driving transistors Td1 in the 10th OB region 70 more, and hence can further prevent erroneous correction of vertical streak noise which is sensitive to noise. A case in which conditions for an HOB region and conditions for a VOB region are combined will be described below. Consider a comparison between HOB clamping and vertical streak noise correction. HOB clamping is performed by using not only signals from light-shielded pixels on a row on which clamping is performed but also signals from light-shielded pixels on the preceding row. In contrast, vertical streak noise correction is performed by adding and averaging signals from vertical pixels in a VOB region and using the resultant signal as a correction signal for the corresponding column. Theoretically, therefore, the number of light-shielded pixels which can be used for vertical streak noise correction is smaller than that for HOB clamping. That is, vertical streak noise correction is more susceptible to noise generated by the driving transistors Td1.

For this reason, it is possible to reduce noise generated by the driving transistors Td1 in the 10th OB region 70 more by setting W in 10th OB region>W in fourth OB region>W1 in effective pixel region and L in 10th OB region>L in fourth OB region>L1 in effective pixel region. This makes it possible to prevent erroneous correction of vertical streak noise which is sensitive to noise.

Consider a comparison between VOB clamping and HOB clamping. It is only necessary for VOB clamping to be complete before signals are read from the effective pixel region. It is therefore possible to perform VOB clamping by using signals from the reference pixels for black level in the entire VOB region. In contrast, HOB clamping is performed by using not only signals from light-shielded pixels on a row on which clamping is performed but also signals from light-shielded pixels on the preceding row. Therefore, the number of light-shielded pixels which can be used for HOB clamping is smaller than that for VOB clamping. That is, HOB clamping is more susceptible to noise generated by the driving transistors Td1.

For this reason, it is possible to reduce noise generated by the driving transistors Td1 in the fourth OB region 64 more by setting W in fourth OB region>W in ninth OB region>W1 in effective pixel region and L in fourth OB region>L in ninth OB region>L1 in effective pixel region. This makes it possible to prevent erroneous HOB clamping which is sensitive to noise. Although there will be no specific description of a comparison between the noise sensitivity of VOB clamping and that of digital clamping, it is possible to set some difference between the gate width (channel width) W and the gate length (channel length) L of the driving transistor Td1 depending on the manner of use.

In addition, digital clamping is performed by adding and averaging reference signals for black level read from an HOB region and subtracting the resultant signal from an output signal read from the effective pixel region as a reference for black level of the output signal read from the effective pixel region. For this reason, it is sometimes convenient to output the same signals as those from effective pixels during a dark time. This can be implemented by arranging the light-shielded pixels 910, which are structurally the same as the photosensitive pixels 110 arranged in the effective pixel region 60 except for light-shielded portions 801, in the third OB region 63, and setting W2 in third OB region=W1 in effective pixel region and L2 in third OB region=L1 in effective pixel region.

A modification of this embodiment will be described next. FIG. 15B is a view showing a modification of the pixel array of the image sensor 2 in this embodiment. Reference numeral 60 denotes an effective pixel region in which the photosensitive pixels 110 including photo-electric conversion elements are arranged; and 68, 69, and 70, an eighth OB region, ninth OB region, and 10th OB region, respectively, in which light-shielded pixels are arranged. As is obvious from the first to third embodiments, this arrangement has the effect of reducing noise generated by the driving transistors Td1 as compared with the photosensitive pixels 110 regardless of whether the first light-shielded pixels 910, second light-shielded pixels 920, third light-shielded pixels 930, or fourth light-shielded pixels 940 are arranged in the eighth OB region 68, ninth OB region 69, and 10th OB region 70.

Furthermore, the eighth OB region 68, ninth OB region 69, and 10th OB region 70 are respectively defined as the third HOB region, fourth VOB region, and fifth VOB region. It is possible to reduce noise generated by the driving transistors Td1 in the 10th OB region 70 more by making the eighth OB region 68 operate in the same manner as the HOB region in the first embodiment, and arranging light-shielded pixels in the ninth OB region 69 and 10th OB region 70 so as to satisfy conditions (3) and (4) for the VOB regions in this embodiment. This makes it possible to further prevent erroneous correction of vertical streak noise correction which is sensitive to noise.

Figure 15C:
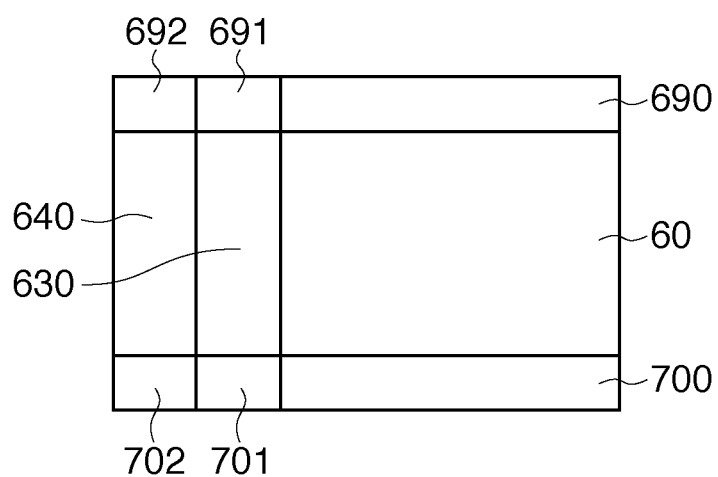

FIG. 15C is a view showing a modification of the pixel array in FIG. 15A. Reference numeral 60 denotes an effective pixel region in which the photosensitive pixels 110 including photo-electric conversion elements are arranged; and 630, 640, 690, 691, 692, 700, 701, and 702, OB regions in which light-shielded pixels are arranged. As is obvious from the first to third embodiments, this arrangement has the effect of reducing noise generated by the driving transistors Td1 as compared with the photosensitive pixels 110 regardless of whether the first light-shielded pixels 910, second light-shielded pixels 920, third light-shielded pixels 930, or fourth light-shielded pixels 940 are arranged in the OB regions 630, 640, 690, 691, 692, 700, 701, and 702.

In addition, referring to FIG. 15C, the ninth OB region 69 and the 10th OB region 70 as VOB regions having the pixel array in FIG. 15A are segmented into the OB regions 690, 691, 692, 700, 701, and 702 in accordance with the width of the HOB region. Although the OB regions 630, 640, 690, and 700 are made to operate in the same manner as the first HOB region, second HOB region, fourth VOB region, and fifth VOB region, the OB regions 691, 692, 701, and 702 may be used as either HOB regions or VOB regions or may serve as both HOB regions and VOB regions.

Unlike in this embodiment, in the fourth embodiment, the fifth OB region 65 as the first VOB region used for vertical streak noise correction is placed between the effective pixel region 60 and the sixth OB region 66 as the second VOB region. For this reason, arranging the third light-shielded pixels 930 or the fourth light-shielded pixels 940 including no photo-electric conversion elements D1 in the fifth OB region 65 may increase the structural difference between the relationship between the effective pixel region 60 and the fifth OB region 65 and the relationship between the fifth OB region 65 and the sixth OB region 66. In this embodiment, however, the 10th OB region 70 as the fifth VOB region used for vertical streak noise correction is located under the effective pixel region 60. For this reason, even arranging the third light-shielded pixels 930 including no photo-electric conversion elements D1 or the fourth light-shielded pixels 940 in the 10th OB region 70 does not produce much structural difference.

Sixth Embodiment

Figure 16:
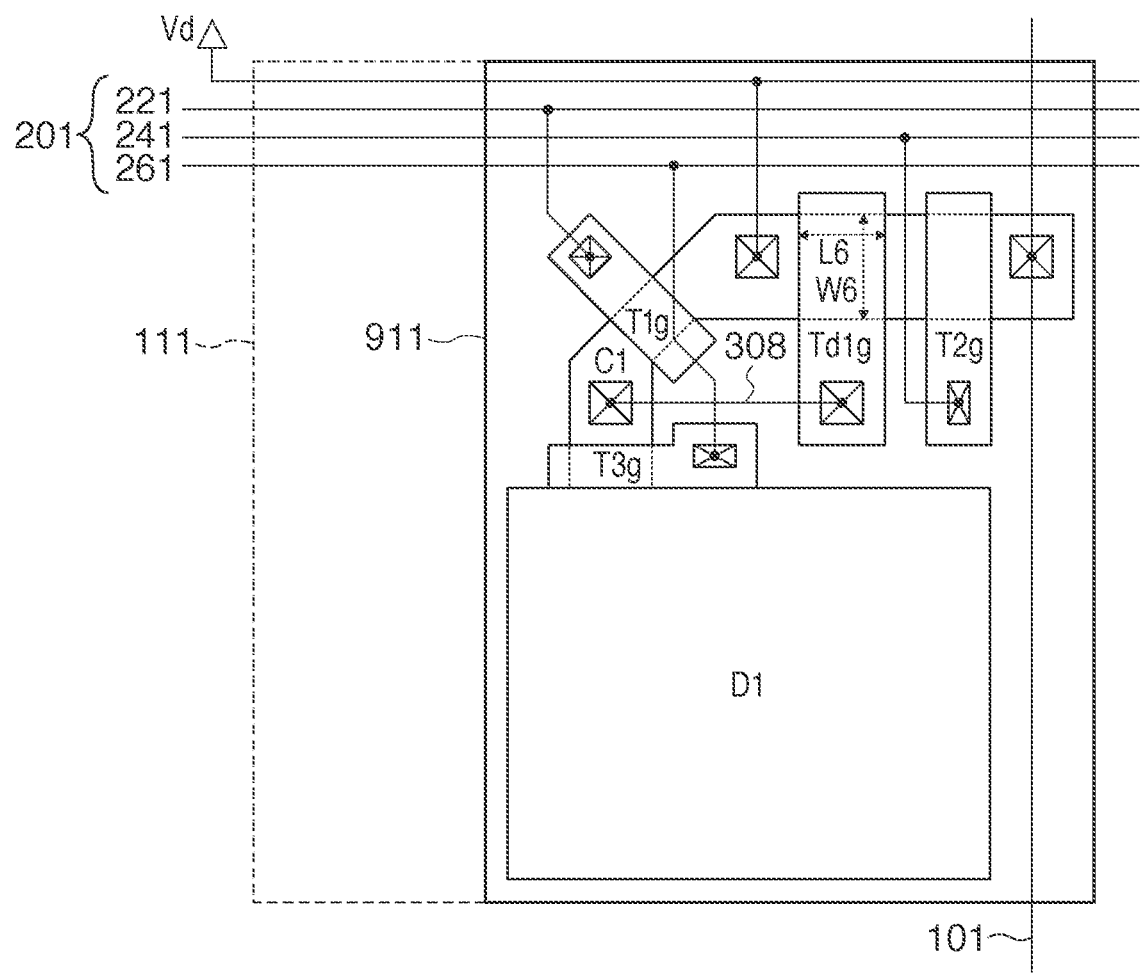
FIG. 16 is a view showing the layout of a light-shielded pixel of the image sensor.
Figure 17:
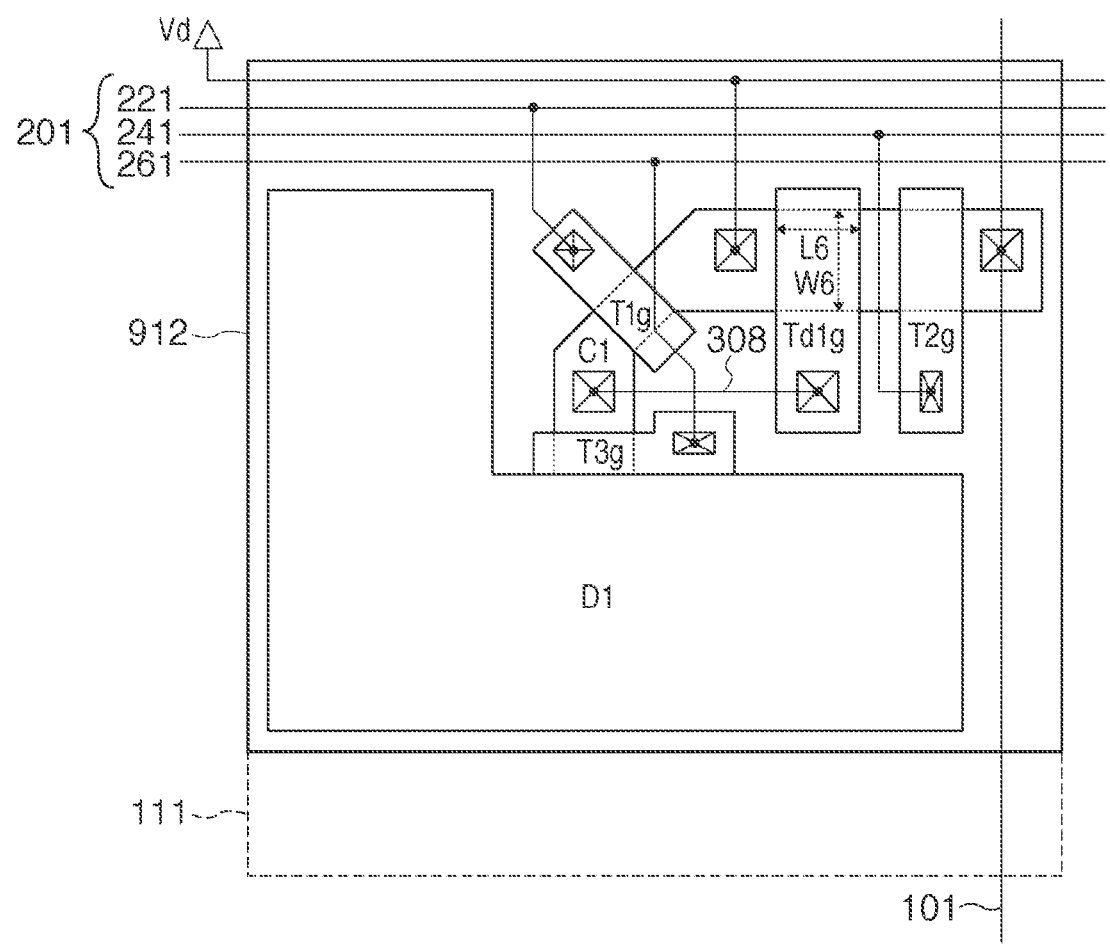
FIG. 17 is a view showing the layout of a light-shielded pixel of the image sensor.
Figure 18:
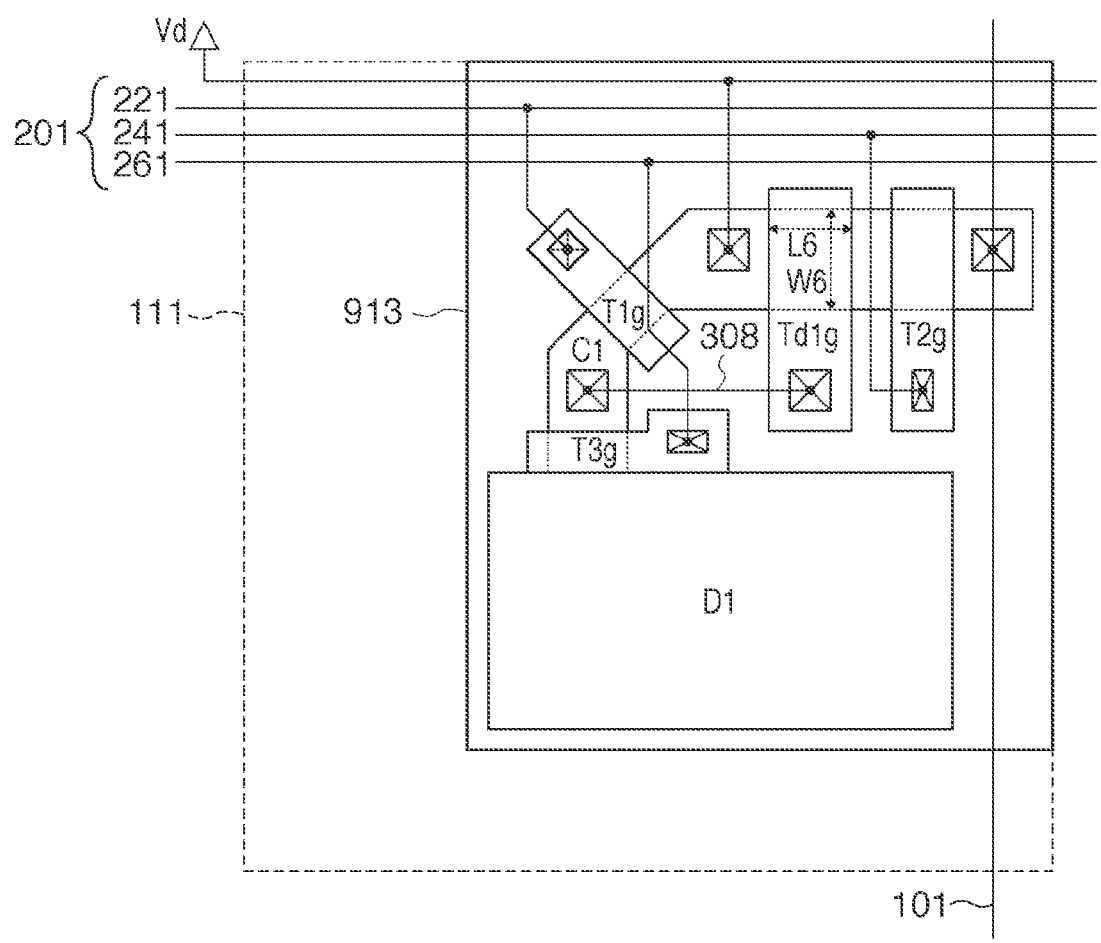
FIG. 18 is a view showing the layout of a light-shielded pixel of the image sensor.
Figure 19:
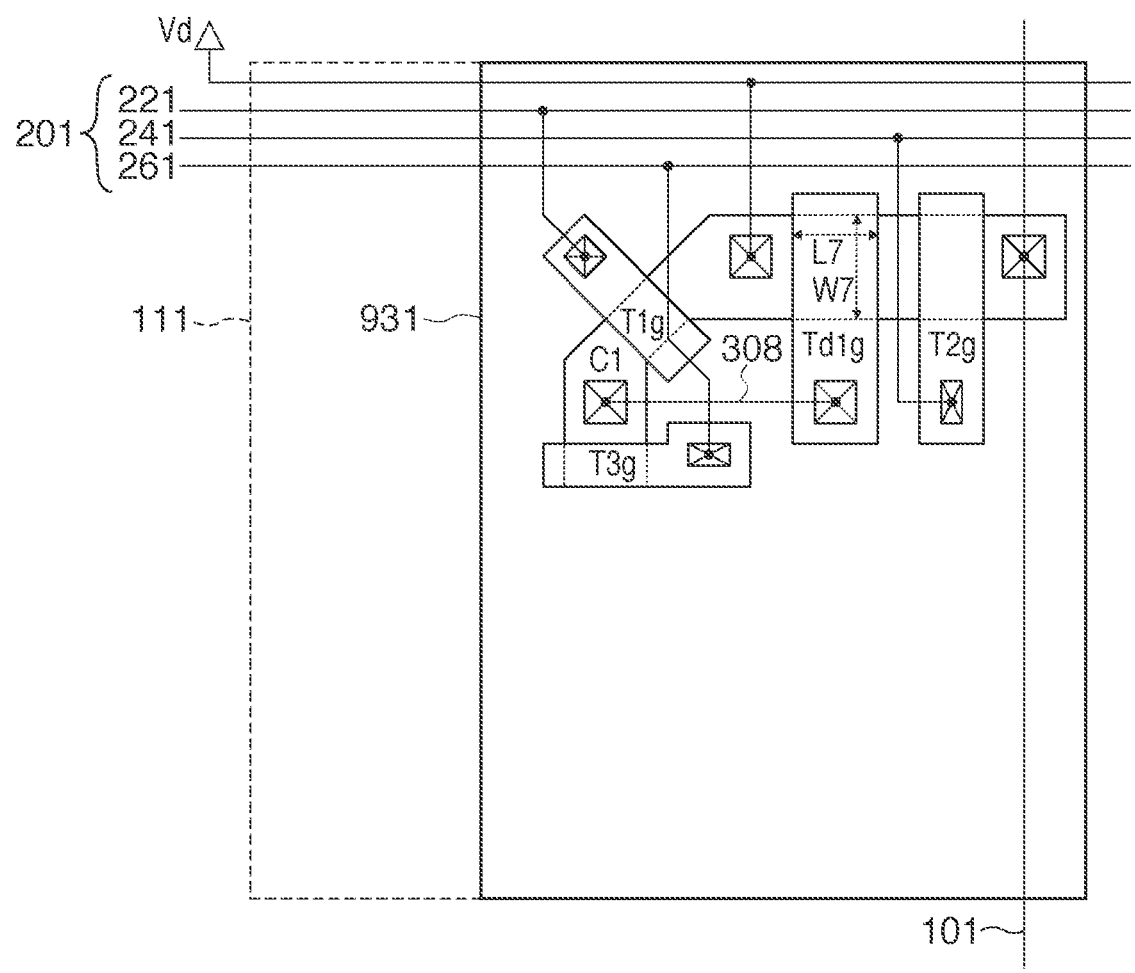
FIG. 19 is a view showing the layout of a light-shielded pixel of the image sensor.
Figure 20:
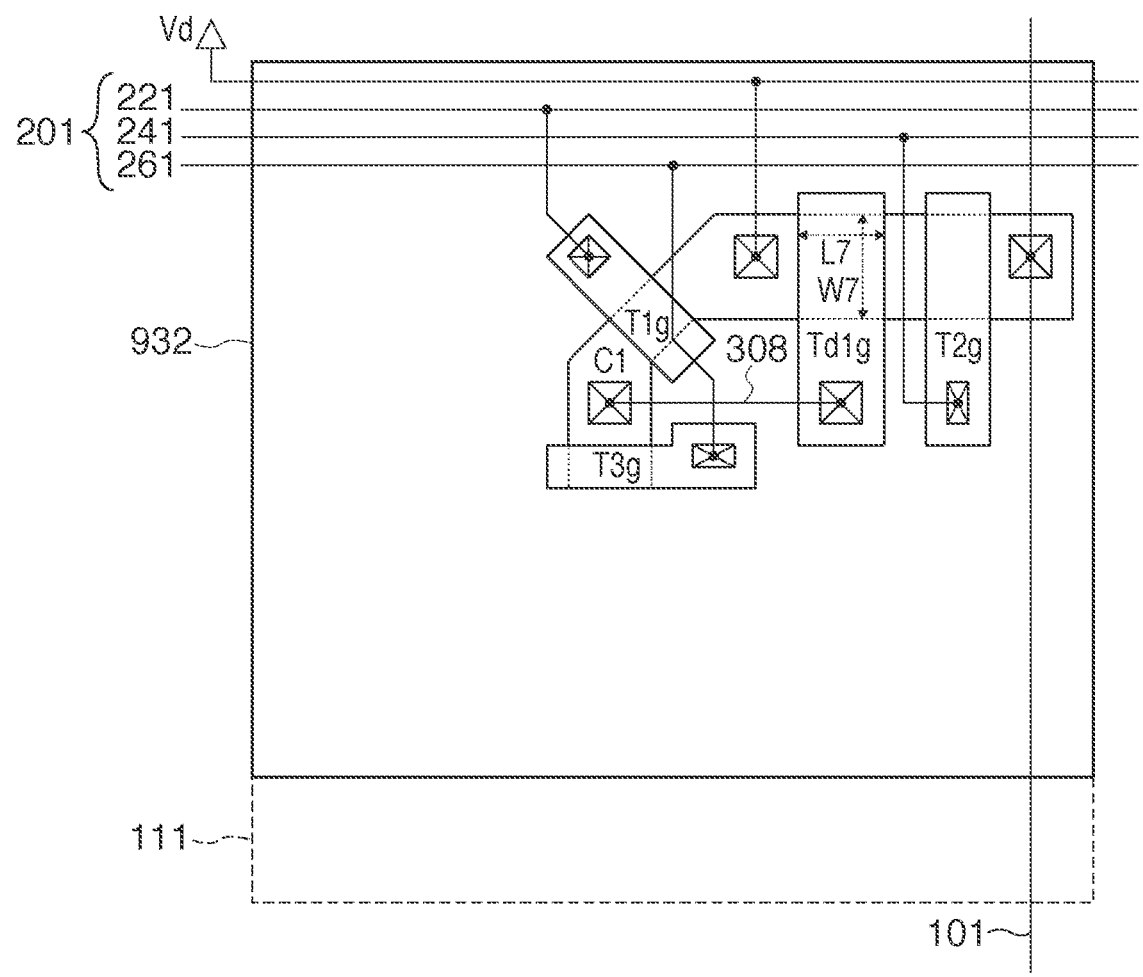
FIG. 20 is a view showing the layout of a light-shielded pixel of the image sensor.
Figure 21:
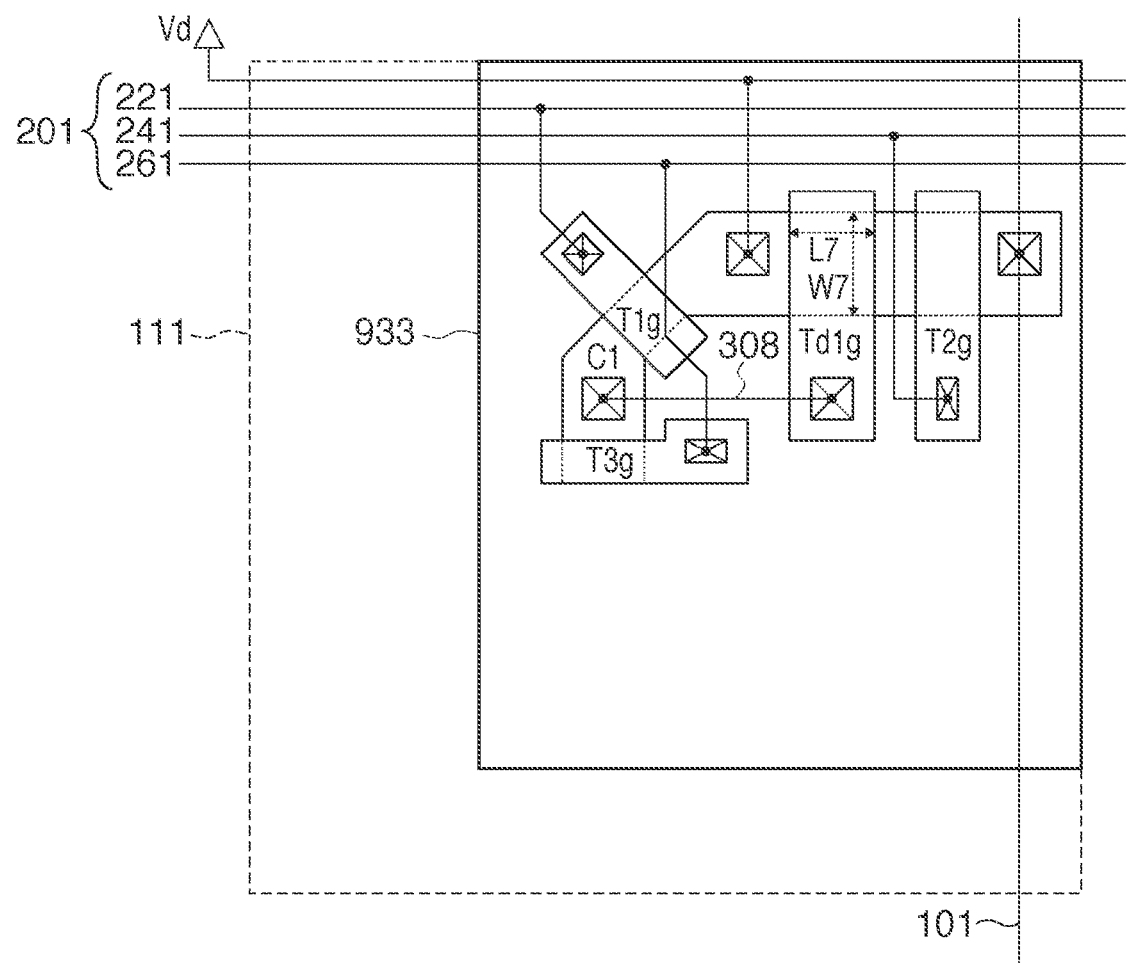
FIG. 21 is a view showing the layout of a light-shielded pixel of the image sensor.
Figure 22:
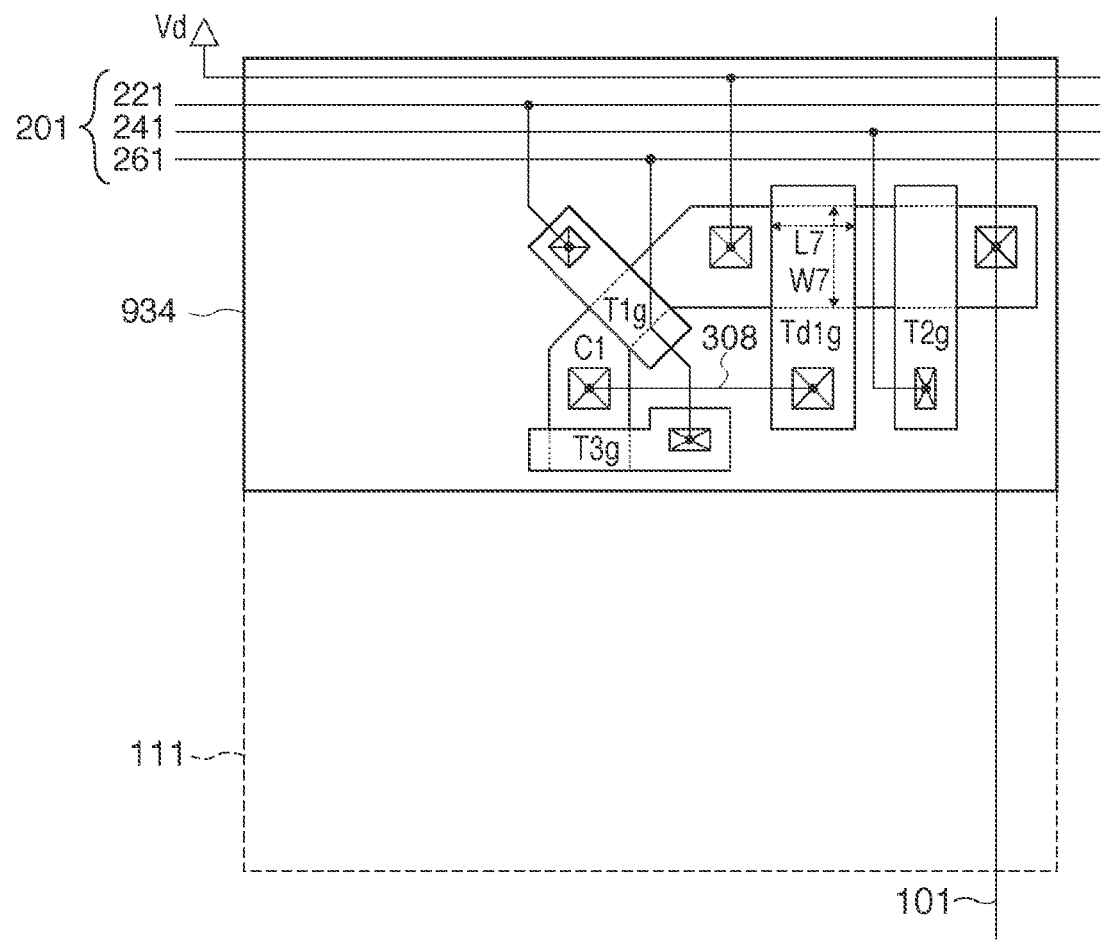
FIG. 22 is a view showing the layout of a light-shielded pixel of the image sensor.
Figure 23:
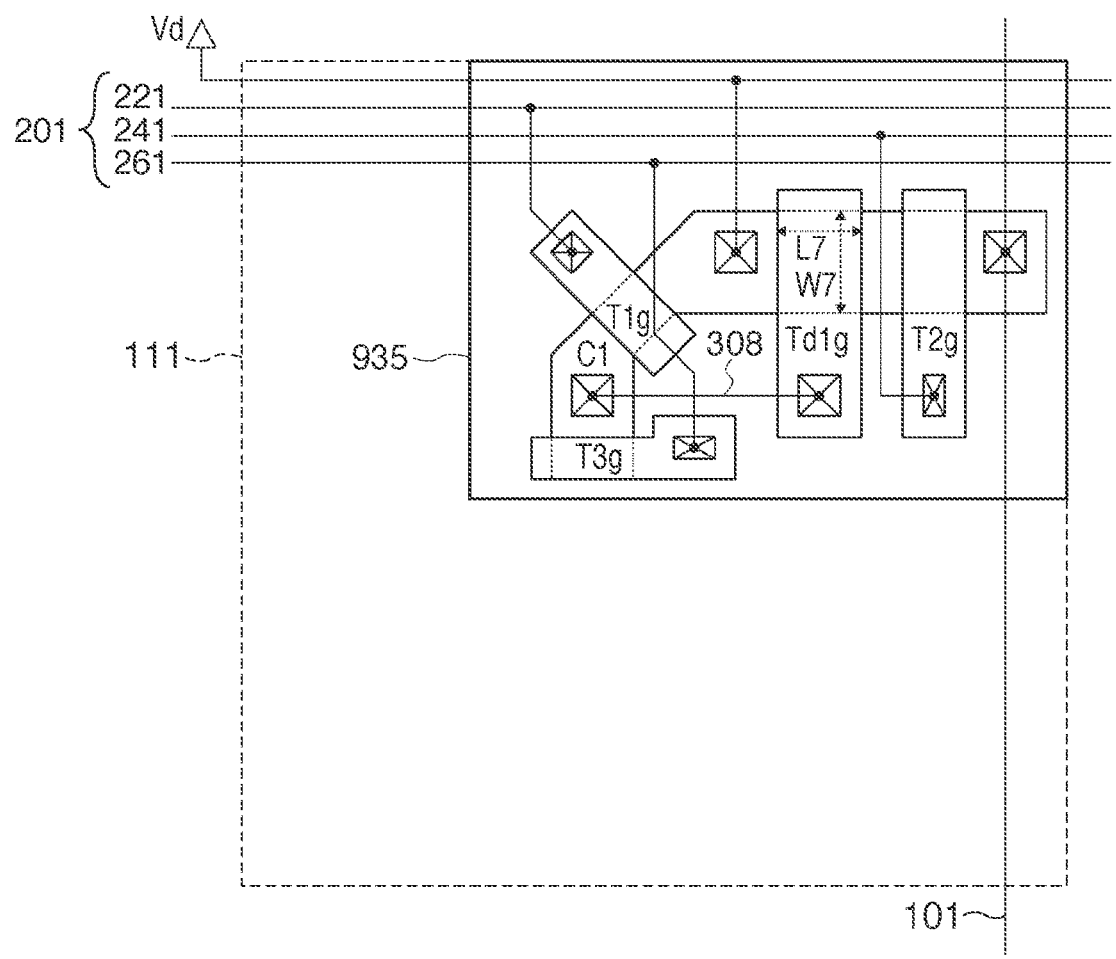
FIG. 23 is a view showing the layout of a light-shielded pixel of the image sensor.

An image capturing apparatus as the sixth embodiment of the present invention will be described next with reference to FIGS. 16 to 23 in addition to FIGS. 15A to 15C. Note that the basic arrangement and operation of the image capturing apparatus and the basic arrangement and operation of the image sensor according to this embodiment are the same as those in the first to fifth embodiments, and hence will be described by using the same drawings and reference numerals as in the first to fifth embodiments. FIGS. 16 to 18 show modifications of the layout of the light-shielded pixel including a photo-electric conversion element. The same reference numerals and symbols as those of a first light-shielded pixel 910 in FIG. 9 denote the same components in FIGS. 16 to 18. A light-shielded portion 801 will not be illustrated, although light is shielded. A cross-section of each arrangement is the same as that shown in FIG. 7.

Reference numerals 911, 912, and 913 denote light-shielded pixels including photo-electric conversion elements; and 111, the same size as that of the photosensitive pixel 110 for comparison. The gate width (channel width) and gate length (channel length) of a driving transistor Td1 are respectively represented by W6 and L6.

The light-shielded pixel 911 is reduced in size in the horizontal direction by eliminating a portion of a photo-electric conversion element D1 in the horizontal direction. The light-shielded pixel 912 is reduced in size in the vertical direction by eliminating a portion of the photo-electric conversion element D1 in the vertical direction. The light-shielded pixel 913 is reduced in size in the horizontal and vertical directions by eliminating portions of the photo-electric conversion element D1 in the horizontal and vertical directions. Since the light-shielded pixels 911, 912, and 913 need not have sensitivity to light, reductions in the area of the photo-electric conversion element D1 have little influence on reference signals for black level to be read.

FIGS. 19 to 23 show modifications of the layout of the light-shielded pixel including no photo-electric conversion element. The same reference numerals and symbols as those of the third light-shielded pixel 930 in FIG. 12 denote the same components in FIGS. 19 to 23. The light-shielded portion 801 will not be illustrated, although light is shielded. A cross-section of each arrangement is the same as that shown in FIG. 7 except that it does not include the photo-electric conversion element D1 denoted by reference numeral 301 in FIG. 7. Reference numerals 931, 932, 933, 934, and 935 denote light-shielded pixels including no photo-electric conversion elements; and 111, the same size as that of the photosensitive pixel 110 for comparison. The gate width (channel width) and gate length (channel length) of a driving transistor Td1 are respectively represented by W7 and L7.

The light-shielded pixel 931 is reduced in size in the horizontal direction so as to have the same size as that of the light-shielded pixel 911. The light-shielded pixel 932 is reduced in size in the vertical direction so as to have the same size as that of the light-shielded pixel 912. The light-shielded pixel 933 is reduced in size in the horizontal and vertical directions so as to have the same size as that of the light-shielded pixel 913. The light-shielded pixel 934 is reduced in size in the vertical direction more than the light-shielded pixel 932. The light-shielded pixel 935 is reduced in size in the vertical direction more than the light-shielded pixel 933. In this case, the light-shielded pixels 931, 932, 933, 934, and 935 include no photo-electric conversion elements D1, and hence are free from the influence of the dark currents generated in the photo-electric conversion elements D1. For this reason, noise in reference signals for black level to be read is much smaller than that in the first and second light-shielded pixels 910 and 920.

The following are cases in which the pixel arrays shown in FIGS. 5, 14A to 14E, and 15A to 15C are applied to these light-shielded pixels.

(1) Case in which Light-Shielded Pixels 911 or 931 are Arranged in HOB Region, and Light-Shielded Pixels 910 or 930 are Arranged in VOB Region As is obvious from the first to third embodiments, this arrangement has the effect of reducing noise generated by the driving transistors Td1 as compared with the photosensitive pixel 110. In addition, since the size of the light-shielded pixel 911 or 931 is smaller in the horizontal direction than that of the photosensitive pixel 110, the number of light-shielded pixels can be increased if the area remains the same. This accordingly increases the effect of reducing noise. In addition, if the number of light-shielded pixels is sufficient and need not be increased, since the area of an HOB region can be reduced, the manufacturing cost can be reduced.

It is possible to arrange the light-shielded pixels 911 or 931 in portions common to the HOB and VOB regions like those shown in FIGS. 14D, 14E, and 15C. In addition, if an HOB region includes the light-shielded pixels 911 and a VOB region includes the light-shielded pixels 910, the light-shielded pixels 911 are arranged in a common portion. If an HOB region includes the light-shielded pixels 911 and a VOB region includes the light-shielded pixels 930, the light-shielded pixels 931 are arranged in a common portion. If an HOB region includes the light-shielded pixels 931, the light-shielded pixels 931 are arranged in a common portion. This improves the structural continuity between the pixels in the respective OB regions, and hence can remove noise without any influence on the characteristics of the light-shielded pixels 110 in an effective pixel region 60.

(2) Case in which Light-Shielded Pixels 910 or 930 are Arranged in HOB Region, and Light-Shielded Pixels 912, 932, or 934 are Arranged in VOB Region As is obvious from the first to third embodiments, this arrangement has the effect of reducing noise generated by the driving transistors Td1 as compared with the photosensitive pixel 110. In addition, since the size of the light-shielded pixel 912, 932, or 934 is smaller in the vertical direction than that of the photosensitive pixel 110, the number of light-shielded pixels can be increased if the area remains the same. This accordingly increases the effect of reducing noise. In addition, if the number of light-shielded pixels is sufficient and need not be increased, since the area of an HOB region can be reduced, the manufacturing cost can be reduced.

It is possible to arrange the light-shielded pixels 912, 932, or 934 in portions common to the HOB and VOB regions like those shown in FIGS. 14D, 14E, and 15C. In addition, if an HOB region includes the light-shielded pixels 910 and a VOB region includes the light-shielded pixels 912, the light-shielded pixels 912 are arranged in a common portion. If an HOB region includes the light-shielded pixels 930 and a VOB region includes the light-shielded pixels 912, the light-shielded pixels 932 are arranged in a common portion. If a VOB region includes the light-shielded pixels 932, the light-shielded pixels 932 are arranged in a common portion. If a VOB region includes the light-shielded pixels 934, the light-shielded pixels 934 are arranged in a common portion. This improves the structural continuity between the pixels in the respective OB regions, and hence can remove noise without any influence on the characteristics of the light-shielded pixels 110 in the effective pixel region 60.

(3) Case in which Light-Shielded Pixels 911 or 931 are Arranged in HOB Region, and Light-Shielded Pixels 912, 932, or 934 are Arranged in VOB Region As is obvious from the first to third embodiments, this arrangement has the effect of reducing noise generated by the driving transistors Td1 as compared with the photosensitive pixel 110. In addition, since the size of the light-shielded pixel 911 or 931 is smaller in the horizontal direction than that of the photosensitive pixel 110, and the size of the light-shielded pixels 912, 932, or 934 is smaller in the vertical direction than that of the photosensitive pixel 110, the number of light-shielded pixels can be increased if the area remains the same. This accordingly increases the effect of reducing noise. In addition, if the number of light-shielded pixels is sufficient and need not be increased, since the areas of HOB and VOB regions can be reduced, the manufacturing cost can be reduced.

It is possible to arrange the light-shielded pixels 912, 932, or 934 in portions common to the HOB and VOB regions like those shown in FIGS. 14D, 14E, and 15C. In addition, if an HOB region includes the light-shielded pixels 911 and a VOB region includes the light-shielded pixels 912, the light-shielded pixels 913 are arranged in a common portion. If an HOB region includes the light-shielded pixels 931 and a VOB region includes the light-shielded pixels 912, the light-shielded pixels 933 are arranged in a common portion. If a VOB region includes the light-shielded pixels 932, the light-shielded pixels 933 are arranged in a common portion. If a VOB region includes the light-shielded pixels 934, the light-shielded pixels 935 are arranged in a common portion. This improves the structural continuity between the pixels in the respective OB regions, and hence can remove noise without any influence on the characteristics of the light-shielded pixels 110 in the effective pixel region 60.

The following are cases in which the light-shielded pixels 911, 912, 913, 931, 932, 933, 934, and 935 are applied to the pixel array in FIG. 14E based on the above idea.

First Array Example

The light-shielded pixels 911 are arranged in an OB region 630 as the first HOB region. The light-shielded pixels 911 are arranged in an OB region 640 as the second HOB region. The light-shielded pixels 912 are arranged in an OB region 650 as the first VOB region. The light-shielded pixels 913 are arranged in an OB region 651 as the first VOB region. The light-shielded pixels 913 are arranged in an OB region 652 as the second HOB region. The light-shielded pixels 912 are arranged in an OB region 660 as the second VOB region. The light-shielded pixels 913 are arranged in OB region 661 and 662 as the second VOB regions.

In this case, it is possible to reduce noise generated by the driving transistors Td1 more in the second HOB region by setting conditions for gate widths (channel widths) W and gate lengths (channel lengths) L in the first HOB region and second HOB region so as to satisfy W in second HOB region>W in first HOB region>W1 in effective pixel region and L in second HOB region>L in first HOB region>L1 in effective pixel region. This can further prevent erroneous correction of HOB clamping which is sensitive to noise.

In addition, it is possible to reduce noise generated by the driving transistors Td1 in the first VOB region more by setting conditions for the gate widths (channel widths) W and gate lengths (channel lengths) L in the first VOB region and second VOB region so as to satisfy W in first VOB region>W in second VOB region>W1 in effective pixel region and L in first VOB region>L in second VOB region>L1 in effective pixel region. This can further prevent erroneous correction of vertical streak noise which is sensitive to noise.

Second Array Example

The light-shielded pixels 911 are arranged in the OB region 630 as the first HOB region. The light-shielded pixels 931 are arranged in the OB region 640 as the second HOB region. The light-shielded pixels 912 are arranged in the OB region 650 as the first VOB region. The light-shielded pixels 913 are arranged in the OB region 651 as the first VOB region. The light-shielded pixels 933 are arranged in the OB region 652 as the second HOB region. The light-shielded pixels 932 are arranged in the OB region 660 as the second VOB region. The light-shielded pixels 933 are arranged in the OB region 661 as the second VOB region. The light-shielded pixels 933 are arranged in the OB region 662 as the second VOB region.

In this case as well, it is possible to further prevent erroneous correction of HOB clamping which is sensitive to noise by setting conditions for the gate widths (channel widths) W and gate lengths (channel lengths) L in the first HOB region and second HOB region in the same manner as for the first array example. In addition, it is possible to further prevent erroneous correction of vertical streak noise which is sensitive to noise by setting conditions for the gate widths (channel widths) W and gate lengths (channel lengths) L in the first VOB region and second VOB region in the same manner as for the first array example.

Since light-shielded pixels including no photo-electric conversion elements D1 are arranged in the second HOB region and second VOB region, the regions are free from the influence of the dark currents generated by the photo-electric conversion elements D1. For this reason, noise in readout reference signals for black level in these pixels is much smaller than those in the light-shielded pixels in the first HOB region and first VOB region.

Third Array Example

The light-shielded pixels 911 are arranged in the OB region 630 as the first HOB region. The light-shielded pixels 931 are arranged in the OB region 640 as the second HOB region. The light-shielded pixels 932 are arranged in the OB region 650 as the first VOB region. The light-shielded pixels 933 are arranged in the OB region 651 as the first VOB region. The light-shielded pixels 933 are arranged in the OB region 652 as the second HOB region. The light-shielded pixels 934 are arranged in the OB region 660 as the second VOB region. The light-shielded pixels 935 are arranged in the OB region 661 as the second VOB region. The light-shielded pixels 935 are arranged in the OB region 662 as the second VOB region.

In this case as well, it is also possible to further prevent erroneous correction of HOB clamping which is sensitive to noise by setting conditions for the gate widths (channel widths) W and gate lengths (channel lengths) L in the first HOB region and second HOB region in the same manner as for the first array example. In addition, it is possible to further prevent erroneous correction of vertical streak noise which is sensitive to noise by setting conditions for the gate widths (channel widths) W and gate lengths (channel lengths) L in the first VOB region and second VOB region in the same manner as for the first array example.

In addition, since light-shielded pixels including no photo-electric conversion elements D1 are arranged in the second HOB region, first VOB region, and second VOB region, the regions are free from the influence of the dark currents generated by the photo-electric conversion elements D1. For this reason, noise in readout reference signals for black level from these pixels is much smaller than those from the light-shielded pixels in the first HOB region. In addition, since the sizes of the light-shielded pixels 934 and 935 in the second VOB region are smaller in the vertical direction than those of the light-shielded pixels 932 and 933 in the first VOB region, the number of light-shielded pixels can be increased if the area remains the same. This accordingly increases the effect of reducing noise. Alternatively, if the number of light-shielded pixels is sufficient and need not be increased, since the area of an HOB region can be reduced, the manufacturing cost can be reduced.

The following are cases in which the light-shielded pixels 911, 912, 913, 931, 932, 933, 934, and 935 are applied to the pixel array in FIG. 15C in the same manner as described above.

Fourth Array Example

The light-shielded pixels 911 are arranged in the OB region 630 as the first HOB region. The light-shielded pixels 911 are arranged in the OB region 640 as the second HOB region. The light-shielded pixels 912 are arranged in the OB region 690 as the fourth VOB region. The light-shielded pixels 913 are arranged in the OB region 691 as the fourth VOB region. The light-shielded pixels 913 are arranged in the OB region 692 as the fourth VOB region. The light-shielded pixels 932 are arranged in the OB region 700 as the fifth VOB region. The light-shielded pixels 933 are arranged in the OB regions 701 and 702 as the fifth VOB regions.

In this case as well, it is possible to further prevent erroneous correction of HOB clamping which is sensitive to noise by setting conditions for the gate widths (channel widths) W and gate lengths (channel lengths) L in the first HOB region and second HOB region in the same manner as for the first array example. In addition, it is possible to reduce noise generated by the driving transistors Td1 in the fifth VOB region more by setting conditions for the gate widths (channel widths) W and gate lengths (channel lengths) L in the fourth VOB region and fifth VOB region so as to satisfy W in fifth VOB region>W in fourth VOB region>W1 in effective pixel region and L in fifth VOB region>L in fourth VOB region>L1 in effective pixel region. This can further prevent erroneous correction of vertical streak noise which is sensitive to noise.

In addition, since light-shielded pixels including no photo-electric conversion elements D1 are arranged in the fifth VOB region, the region is free from the influence of the dark currents generated by the photo-electric conversion elements D1. For this reason, noise in readout reference signals for black level from these pixels is much smaller than those from the light-shielded pixels in the fourth VOB region.

Fifth Array Example

The light-shielded pixels 911 are arranged in the OB region 630 as the first HOB region. The light-shielded pixels 931 are arranged in the OB region 640 as the second HOB region. The light-shielded pixels 932 are arranged in the OB region 690 as the fourth VOB region. The light-shielded pixels 933 are arranged in the OB region 691 as the fourth VOB region. The light-shielded pixels 933 are arranged in the OB region 692 as the fourth VOB region. The light-shielded pixels 934 are arranged in an OB region 700 as the fifth VOB region. The light-shielded pixels 935 are arranged in an OB region 701 as the fifth VOB region. The light-shielded pixels 935 are arranged in an OB region 702 as the second HOB region.

In this case as well, it is possible to further prevent erroneous correction of HOB clamping which is sensitive to noise by setting conditions for the gate widths (channel widths) W and gate lengths (channel lengths) L in the first HOB region and second HOB region in the same manner as for the first array example. In addition, it is possible to further prevent erroneous correction of vertical streak noise by setting conditions for the gate widths (channel widths) W and gate lengths (channel lengths) L in the fourth VOB region and fifth VOB region in the same manner as for the fourth array example.

In addition, since light-shielded pixels including no photo-electric conversion elements D1 are arranged in the second HOB region, fourth VOB region, and fifth VOB region, the regions are free from the influence of the dark currents generated by the photo-electric conversion elements D1. For this reason, noise in readout reference signals for black level from these pixels is much smaller than those from the light-shielded pixels in the first HOB region. Furthermore, since the sizes of the light-shielded pixels 934 and 935 in the fifth VOB region are slightly smaller in the vertical direction than those of the light-shielded pixels 932 and 933 in the fourth VOB region. Therefore, if the area remains the same, since the number of light-shielded pixels can be increased, it is possible to further prevent erroneous correction of vertical streak noise which is sensitive to noise.

As described above, in the first to sixth embodiments, each light-shielded pixel in each embodiment of the present invention has the effect of reducing noise generated by the driving transistor Td1 as compared with each photosensitive pixel.

This makes it possible to suppress noise in a manner suitable for each of HOB clamping, VOB clamping, vertical streak noise correction, and digital clamping. The fourth, fifth, and sixth embodiments have been described with the number of HOB regions being set to 1 or 2. However, three or more HOB regions may be used, and the gate widths (channel widths) W and gate lengths (channel lengths) L of the driving transistors Td1 of light-shielded pixels and the sizes of the light-shielded pixels in the horizontal direction in the respective HOB regions may differ from each other.

The fourth, fifth, and sixth embodiments have been described with the number of VOB regions being set to 1 or 2. However, three or more VOB regions may be used, and the gate widths (channel widths) W and gate lengths (channel lengths) L of the driving transistors Td1 of light-shielded pixels and the sizes of the light-shielded pixels in the vertical direction in the respective VOB regions may differ from each other. Furthermore, the use of OB regions is not limited to HOB clamping, VOB clamping, vertical streak noise correction, and digital clamping.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-167265, filed Jul. 15, 2009, which is hereby incorporated by reference herein in its entirety.

What is claimed is:

1. An image capturing apparatus comprising:
an image sensor including a first reference pixel for black level, a second reference pixel for black level different from the first reference pixel for black level, and an effective pixel; and
a processing unit which applies first processing to an output signal from the effective pixel based on an output signal from the first reference pixel for black level, and applies second processing to an output signal from the effective pixel based on an output signal from the second reference pixel for black level,
wherein the first reference pixel for black level and the second reference pixel for black level each include a charge-voltage converter which converts electric charge into a voltage and a pixel amplifier which amplifies a voltage of the charge-voltage converter, and
the pixel amplifier of the first reference pixel for black level and the pixel amplifier of the second reference pixel for black level each include at least one transistor a gate of which is connected to each charge-voltage converter to constitute a source-follower circuit, and the first reference pixel for black level differs from the second reference pixel for black level in at least one of a gate width and a gate length of the transistor of the pixel amplifier.

2. The apparatus according to claim 1, wherein the gate width of the transistor of the pixel amplifier of the first reference pixel for black level is larger than the gate width of the transistor of the pixel amplifier of the second reference pixel for black level.

3. The apparatus according to claim 1, wherein the gate length of the transistor of the pixel amplifier of the first reference pixel for black level is larger than the gate length of the transistor of the pixel amplifier of the second reference pixel for black level.

4. The apparatus according to claim 1, wherein the effective pixel includes a photo-electric converter which converts an optical signal into electric charge, a charge-voltage converter, and a pixel amplifier, and
the pixel amplifier of the effective pixel includes at least one transistor which is connected to the charge-voltage converter to constitute a source-follower circuit, and the second reference pixel for black level differs from the effective pixel in an arrangement of the pixel amplifier.

5. The apparatus according to claim 4, wherein the second reference pixel for black level differs from the effective pixel in at least one of the gate width and the gate length of the transistor of the pixel amplifier.

6. The apparatus according to claim 5, wherein the gate width of the transistor of the pixel amplifier of the second reference pixel for black level is larger than the gate width of the transistor of the pixel amplifier of the effective pixel.

7. The apparatus according to claim 5, wherein the gate length of the transistor of the pixel amplifier of the second reference pixel for black level is larger than the gate length of the transistor of the pixel amplifier of the effective pixel.

8. The apparatus according to claim 1, wherein the first reference pixel for black level includes no photo-electric converter.

9. The apparatus according to claim 1, wherein the first processing is clamping processing in a horizontal direction, and the second processing is clamping processing in a vertical direction.

10. The apparatus according to claim 1, wherein the first processing is digital clamping processing, and the second processing is vertical streak noise correction processing.

11. The apparatus according to claim 1, wherein the second processing is vertical streak noise correction processing or clamping processing in the vertical direction.

12. The apparatus according to claim 1, wherein the first processing is clamping processing in the horizontal direction or digital clamping processing.

13. A control method for an image capturing apparatus comprising an image sensor including a first reference pixel for black level, a second reference pixel for black level different from the first reference pixel for black level, and an effective pixel, the method comprising:
making each of the first reference pixel for black level and the second reference pixel for black level include a charge-voltage converter which converts electric charge into a voltage and a pixel amplifier which amplifies a voltage of the charge-voltage converter, with the pixel amplifier of the first reference pixel for black level and the pixel amplifier of the second reference pixel for black level each include at least one transistor a gate of which is connected to each charge-voltage converter to constitute a source-follower circuit, and the first reference pixel for black level differs from the second reference pixel for black level in at least one of a gate width and a gate length of the transistor of the pixel amplifier; and
applying first processing to an output signal from the effective pixel based on an output signal from the first reference pixel for black level, and applying second processing to an output signal from the effective pixel based on an output signal from the second reference pixel for black level.

* * * * *